United States Patent
Chang et al.

(10) Patent No.: US 12,081,231 B2
(45) Date of Patent: Sep. 3, 2024

(54) CONFIGURABLE VOLTAGE REGULATOR CIRCUIT AND TRANSMITTER CIRCUIT

(71) Applicant: M31 TECHNOLOGY CORPORATION, Hsinchu County (TW)

(72) Inventors: Ching-Hsiang Chang, Hsinchu (TW); Yu-Hsun Chien, Hsinchu (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 18/470,413

(22) Filed: Sep. 19, 2023

(65) Prior Publication Data

US 2024/0007122 A1    Jan. 4, 2024

Related U.S. Application Data

(63) Continuation of application No. 17/223,905, filed on Apr. 6, 2021, now Pat. No. 11,799,492.

(Continued)

(51) Int. Cl.
*H03M 1/46* (2006.01)
*G05F 1/46* (2006.01)
(Continued)

(52) U.S. Cl.
CPC ............ *H03M 1/466* (2013.01); *G05F 1/461* (2013.01); *G05F 1/468* (2013.01); *H03L 7/0807* (2013.01);
(Continued)

(58) Field of Classification Search
CPC .................................. G05F 1/461; G05F 1/468
See application file for complete search history.

(56) References Cited

U.S. PATENT DOCUMENTS 6,204,692 B1    3/2001   Nakagawa
7,541,797 B2 *  6/2009   Dequina ................... G05F 1/46
                                                                323/280

(Continued)

FOREIGN PATENT DOCUMENTS

| CN | 104065380 A | 9/2014 |
| JP | 2014123796 A | 7/2014 |
| TW | I568183 B | 1/2017 |

OTHER PUBLICATIONS

English abstract translation of CN104065380.
(Continued)

*Primary Examiner* — Jue Zhang
*Assistant Examiner* — Lakaisha Jackson
(74) *Attorney, Agent, or Firm* — WPAT, P.C.; Anthony King

(57) ABSTRACT

A voltage regulator circuit includes a first amplifier, a second amplifier and a transistor. Respective first input terminals of the first and second amplifiers are coupled to a first reference voltage and a second reference voltage, respectively. A connection terminal of the transistor is coupled to a supply voltage. A control terminal of the transistor is selectively coupled to one of respective output terminals of the first and second amplifiers. When the control terminal of the transistor is coupled to the output terminal of the first amplifier, another connection terminal of the transistor is coupled to a second input terminal of the first amplifier to output a regulated voltage. When the control terminal of the transistor is coupled to the output terminal of the second amplifier, the another connection terminal of the transistor is coupled to a second input terminal of the second amplifier to output the regulated voltage.

20 Claims, 17 Drawing Sheets

Related U.S. Application Data

(60) Provisional application No. 63/005,943, filed on Apr. 6, 2020.

(51) Int. Cl.
    *H03L 7/08*         (2006.01)
    *H03L 7/089*       (2006.01)
    *H03M 1/12*        (2006.01)
    *H04B 1/40*        (2015.01)
    *H04L 7/033*       (2006.01)

(52) U.S. Cl.
    CPC ........ *H03L 7/0891* (2013.01); *H03M 1/1245* (2013.01); *H03M 1/462* (2013.01); *H04B 1/40* (2013.01); *H04L 7/0331* (2013.01)

(56) References Cited

U.S. PATENT DOCUMENTS

| | | |
|---|---|---|
| 8,487,654 B1 | 7/2013 | Chen |
| 8,811,555 B2 | 8/2014 | Asaduzzaman et al. |
| 2010/0109435 A1* | 5/2010 | Ahmadi .................. G06F 1/26 307/31 |
| 2011/0102049 A1* | 5/2011 | Conte ...................... G05F 3/30 327/307 |
| 2014/0064423 A1 | 3/2014 | Chen et al. |

OTHER PUBLICATIONS

English abstract translation of JP2014123796.
English abstract translation of TWI568183.
Office action issued on Dec. 28, 2023 for corresponding China application 202110368825.9.
Search report issued on Dec. 28, 2023 for corresponding China application 202110368825.9.
Office action issued on Nov. 16, 2023 for corresponding Taiwan application 111144262.

\* cited by examiner

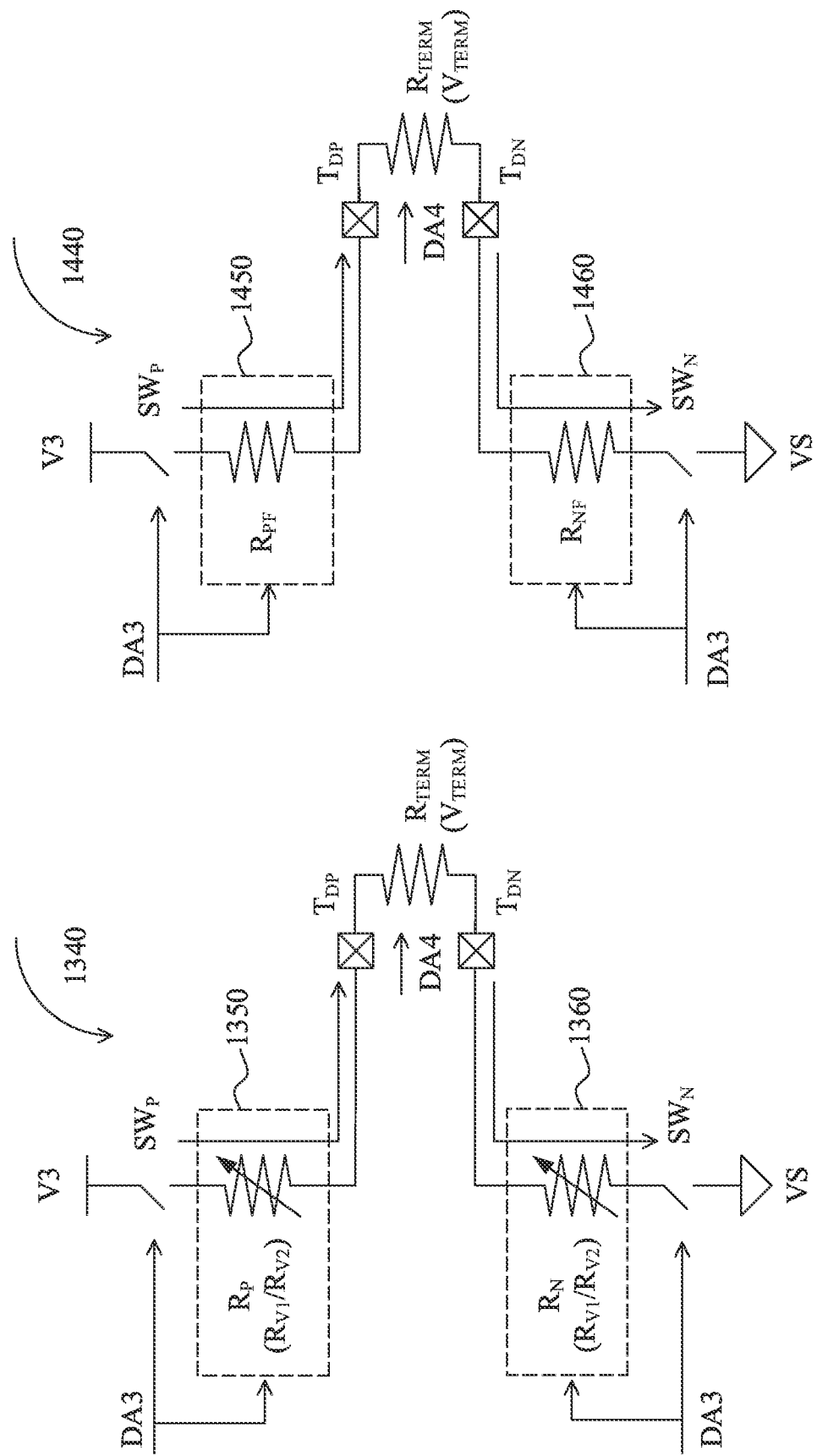

CONFIGURABLE VOLTAGE REGULATOR CIRCUIT AND TRANSMITTER CIRCUIT

PRIORITY CLAIM AND CROSS-REFERENCE

The present application is a continuation of U.S. application Ser. No. 17/223,905 filed Apr. 6, 2021, which claims priority to U.S. Provisional Patent Application No. 63/005,943, filed on Apr. 6, 2020, each of which is incorporated by reference herein in its entirety.

BACKGROUND

The present disclosure relates to data transmission and, more particularly, to a configurable voltage regulator circuit in a transmitter circuit.

High-speed interfaces with low power consumption are adopted to process and transfer large volumes of data in mobile and mobile-influenced applications. For example, MIPI D-PHY, a physical layer (PHY) defined by the Mobile Industry Processor Interface (MIPI) standard, is widely used for cameras and displays in smartphones. MIPI D-PHY uses differential signaling for a bandwidth-limited channel which includes a clock lane and scalable data lanes. To provide much higher throughput over bandwidth-limited channels, another physical layer defined by the MIPI standard, MIPI C-PHY, is developed. MIPI C-PHY introduces three-phase symbol encoding and an embedded clock link to transmit data symbols on three-wire lanes, where each three-wire lane, or a trio, includes an embedded clock. MIPI C-PHY allows higher data rates at a lower toggling frequency, thus providing high speed and low power data transfer.

SUMMARY

The described embodiments provide a voltage regulator circuit, which is configurable to support various interface specifications. In addition, the described embodiments further provide a data serialization circuit and a driver circuit, each of which is capable of supporting various interface specifications. The described embodiments further provide a related transmitter circuit including at least one of the voltage regulator circuit, the data serialization circuit and the driver circuit.

Some embodiments described herein may include a voltage regulator circuit. The voltage regulator circuit includes a first amplifier, a second amplifier and a first transistor. Each of the first amplifier and the second amplifier includes a first input terminal, a second input terminal and an output terminal. The first input terminal of the first amplifier is coupled to a first reference voltage. The first input terminal of the second amplifier is coupled to a second reference voltage. A first connection terminal of the first transistor is coupled to a first supply voltage. A control terminal of the first transistor is selectively coupled to one of the output terminal of the first amplifier and the output terminal of the second amplifier. When the control terminal of the first transistor is coupled to the output terminal of the first amplifier, a second connection terminal of the first transistor is coupled to the second input terminal of the first amplifier to output a first regulated voltage in response to the first reference voltage and the first supply voltage. When the control terminal of the first transistor is coupled to the output terminal of the second amplifier, the second connection terminal of the first transistor is coupled to the second input terminal of the second amplifier to output the first regulated voltage in response to the second reference voltage and the first supply voltage.

Some embodiments described herein may include a voltage regulator circuit for receiving a first supply voltage to generate a first regulated voltage. The voltage regulator circuit includes a first amplifier, a second amplifier, a first transistor, a first switch circuit and a second switch circuit. Each of the first amplifier and the second amplifier comprises a first input terminal, a second input terminal and an output terminal. The first input terminal of the first amplifier is coupled to a first reference voltage. The first input terminal of the second amplifier is coupled to a second reference voltage. A first connection terminal of the first transistor is coupled to the first supply voltage. A second connection terminal of the first transistor is configured to output the first regulated voltage. The first switch circuit is configured to selectively couple one of the output terminal of the first amplifier and the output terminal of the second amplifier to a control terminal of the first transistor. The second switch circuit is configured to selectively couple one of the second input terminal of the first amplifier and the second input terminal of the second amplifier to the second connection terminal of the first transistor.

Some embodiments described herein may include a transmitter circuit. The transmitter circuit includes a data serialization circuit, a decoder, a voltage regulator circuit and a driver circuit. The data serialization circuit is configured to convert an M-bit data signal to a serial data stream according to a first clock signal. M is a positive integer greater than one. The decoder, coupled to the data serialization circuit, is configured to decode the serial data stream to generate decoded data. The voltage regulator circuit, supplied by a first supply voltage and a second supply voltage, is configured to convert the first supply voltage to a third supply voltage. The voltage regulator circuit includes a first amplifier, a second amplifier and a first transistor. Each of the first amplifier and the second amplifier is supplied by the second supply voltage, and includes a first input terminal, a second input terminal and an output terminal. The first input terminal of the first amplifier is coupled to a first reference voltage. The first input terminal of the second amplifier is coupled to a second reference voltage. A first connection terminal of the first transistor is coupled to the first supply voltage. A second connection terminal of the first transistor is arranged to output the third supply voltage. A control terminal of the first transistor is selectively coupled to one of the output terminal of the first amplifier and the output terminal of the second amplifier. The driver circuit is coupled to the decoder, and selectively coupled to one of the second input terminal of the first amplifier and the second input of the second amplifier through a node coupled to the second connection terminal of the first transistor. The driver circuit is configured to generate output data according to the decoded data and the third supply voltage received from the node.

With the use of the proposed configurable voltage regulation scheme or the proposed data transmission scheme, one or more amplifiers can operate together with one or more transistors to implement one or more configurable voltage regulators capable of supporting different lane configurations. Also, data signals compliant with different interface specifications can be successfully received and processed by utilizing the proposed multi-mode data serialization scheme or the data transmission scheme. Further, the proposed driver scheme can be configured as different types of drivers, such as a differential driver, a three-level driver, a four-level driver, a de-emphasis/pre-emphasis driver and/or a high output swing driver. The proposed data transmission scheme can provide a flexible and simplified design compliant with different interface specifications, thus achieving operational flexibility, lowering manufacturing costs and reducing power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 illustrates an implementation of at least a portion of the driver circuit shown in FIG. 1 in accordance with some embodiments of the present disclosure.

FIG. 14 illustrates another implementation of at least a portion of the driver circuit shown in FIG. 1 in accordance with some embodiments of the present disclosure.

DETAILED DESCRIPTION

Figure 1:
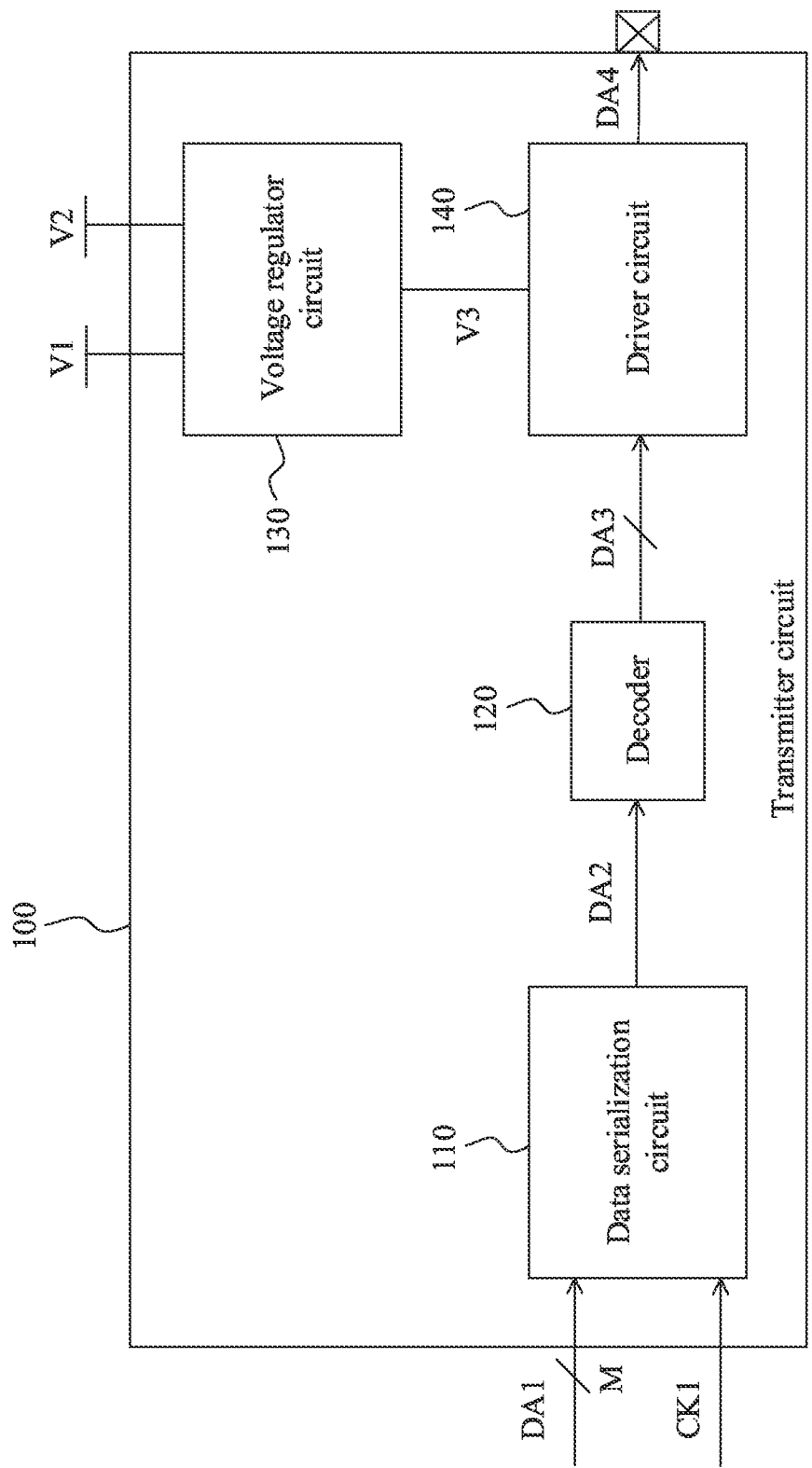
FIG. 1 is a block diagram illustrating an exemplary transmitter circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

To support diversified applications, a transmitter may have separate circuits which are dedicated to different interface standards respectively. For example, MIPI D-PHY can be used in high-definition (HD) smartphone displays, while MIPI C-PHY may be intended for ultra-high-definition (UHD) smartphone displays to achieve a higher data rate per lane. Corresponding interface circuits may be implemented in a same transmitter in order to support both MIPI D-PHY and MIPI C-PHY, which however causes increased chip areas and costs.

The present disclosure describes exemplary transmitter circuits, each of which includes a circuit block capable of supporting various interface specifications. The circuit block includes at least one of a data serialization circuit, a voltage regulator circuit and a driver circuit. The interface specifications include, for example, MIPI D-PHY, MIPI C-PHY, sub-LVDS, LVDS, HDMI and MIPI M-PHY specifications. The present disclosure further describes exemplary driver circuits, each of which can be disposed in a transmitter circuit and includes variable impedance circuits to implement de-emphasis and/or pre-emphasis. Further description is provided below.

FIG. 1 is a block diagram illustrating an exemplary transmitter circuit in accordance with some embodiments of the present disclosure. The transmitter circuit 100 can be configured to transmit M-bit data signal DA1 in different modes of operation to thereby support different interface specifications. M is a positive integer greater than one. The transmitter circuit 100 includes, but is not limited to, a data serialization circuit 110, a decoder 120, a voltage regulator circuit 130 and a driver circuit 140. At least one of the data serialization circuit 110, the decoder 120, the voltage regulator circuit 130 and the driver circuit 140 is configurable to meet the different interface specifications.

The data serialization circuit 110 is configured to convert the M-bit data signal DA1 to a serial data stream DA2 according to a clock signal CK1. In the present embodiment, the data serialization circuit 110 may serialize N bits of the M-bit data signal DA1 at a time. N is a positive integer less than or equal to M, and may vary depending on a mode of operation of the transmitter circuit 100. Additionally, or alternatively, the serial data stream DA2 can be sent out one bit at a time. For example, the clock signal CK1 may be a bit rate clock. The data serialization circuit 110 may output the serial data stream DA2 according to the bit rate clock, thereby realizing N-to-1 data serialization.

The decoder 120, coupled to the data serialization circuit 110, is configured to decode the serial data stream DA2 to generate decoded data DA3. In some embodiments, a bit pattern and/or a bit width of the decoded data DA3 may vary depending on a mode of operation of the transmitter circuit 100.

The voltage regulator circuit 130, supplied by at least two supply voltages V1 and V2, is configured to convert the supply voltage V2 to a supply voltage V3, i.e. a regulated voltage. The supply voltage V3 can be provided to one or more driver circuits (not shown in FIG. 1) besides the driver circuit 140 according to a mode of operation of the transmitter circuit 100. In some embodiments, the supply voltage V2 may be at a voltage level different from a voltage level of the supply voltage V1.

The driver circuit 140, coupled to the decoder 120 and the voltage regulator circuit 130, is configured to generate output data DA4 according to the decoded data DA3 and the supply voltage V3. The driver circuit 140 can be configured as different types of drivers, such as a differential driver and a three-level driver, depending on a mode of operation of the transmitter circuit 100.

Consider an example in which the transmitter circuit 100 is implemented as a C/D PHY combo transmitter circuit capable of supporting both of the MIPI D-PHY and MIPI C-PHY specifications. The transmitter circuit 100 may receive, for example, an 8-bit data signal serving as the M-bit data signal DA1 (M=8). In a mode of operation where the transmitter circuit 100 is configured to support the MIPI D-PHY specification, the data serialization circuit 110 may serialize eight bits of the M-bit data signal DA1 at a time. The decoder 120 may decode the serial data stream DA2 to generate 4-bit data serving as the decoded data DA3. The voltage regulator circuit 130 may provide the supply voltage V3 to two differential drivers in a same signal lane. The driver circuit 140 can be configured as one of the two differential drivers, and generate the output data DA4 according to the decoded data DA3. In another mode of operation where the transmitter circuit 100 is configured to support the MIPI C-PHY specification, the data serialization circuit 110 may serialize seven bits of the M-bit data signal DA1 at a time. The decoder 120 may decode the serial data stream DA2 to generate 4-bit data serving as the decoded data DA3. The voltage regulator circuit 130 may distribute the supply voltage V3 to three three-level drivers in a same signal lane. The driver circuit 140 can be configured as one of the three three-level drivers, and generate the output data DA4 according to the decoded data DA3.

Some embodiments of circuit blocks capable of supporting various interface specifications in the transmitter circuit 100 are given below to facilitate understanding of the present disclosure. However, this is not intended to limit the scope of the present disclosure. Those skilled in the art will recognize that at least one of the circuit blocks described below can be employed in other circuit architectures to implement a multi-mode signal transmission scheme without departing from the scope of the present disclosure.

Figure 2:
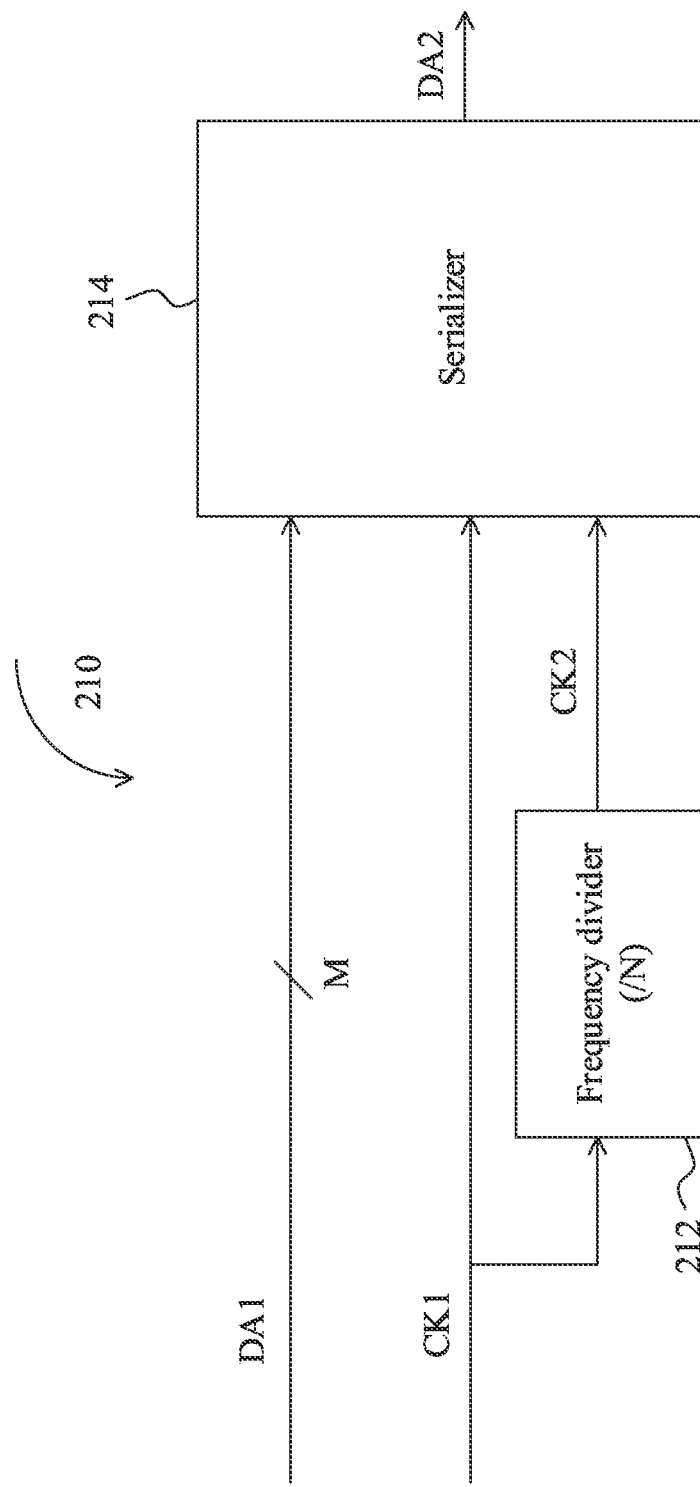
FIG. 2 illustrates an implementation of the data serialization circuit shown in FIG. 1 in accordance with some embodiments of the present disclosure.

Firstly, referring to FIG. 2, an implementation of the data serialization circuit 110 shown in FIG. 1 is illustrated in accordance with some embodiments of the present disclosure. The data serialization circuit 210 includes, but is not limited to, a frequency divider 212 and a serializer 214. The frequency divider 212 can be configured as a dual-mode or multi-mode frequency divider with an adjustable division factor of N. In the present embodiment, the frequency divider 212 is configured to receive the clock signal CK1, and divide a frequency of the clock signal CK1 by the adjustable division factor of N to generate a clock signal CK2. The adjustable division factor can be determined according to an application scenario of the data serialization circuit 210. By way of example but not limitation, the adjustable division factor may be equal to M, i.e. a bit width of the M-bit data signal DA1, in one application scenario of the data serialization circuit 210. The adjustable division factor may be less than M in another application scenario of the data serialization circuit 210.

The serializer 214, coupled to the frequency divider 212, is configured to receive the M-bit data signal DA1 according to the clock signal CK2. Also, the serializer 214 is clocked by the clock signal CK1 to convert the M-bit data signal DA1 to the serial data stream DA2. In the present embodiment, the adjustable division factor can be greater than one in various operating scenarios such that a frequency of the clock signal CK2 is less than the frequency of the clock signal CK1 in these operating scenarios. The serializer 214 can be configured to receive multiple bits at a time in response to each clock cycle of the clock signal CK2, and output one bit at a time in response to each clock cycle of the clock signal CK1, thereby performing parallel-to-serial data conversion upon the M-bit data signal DAL.

Consider an example in which a transmitter circuit the data serialization circuit 210 is applied to, e.g. the transmitter circuit 100 shown in FIG. 1, is implemented as a C/D PHY combo transmitter circuit. In operation, the data serialization circuit 210 may receive, for example, an 8-bit data signal serving as the M-bit data signal DA1 (M=8). In a D-PHY mode, the frequency divider 212 may divide the frequency of the clock signal CK1 by the adjustable division factor equal to eight (i.e. N=M) to generate the clock signal CK2. The clock signals CK1 and CK2 can be referred to as a bit rate clock and a byte rate clock, respectively. The serializer 214 may receive eight bits of the M-bit data signal DA1 at a time in response to each clock cycle of the clock signal CK2 since the clock cycle of the clock signal CK2 is eight times longer than that of a bit rate clock, i.e. the clock signal CK1. Next, the serializer 214 is clocked by the clock signal CK1 to output the serial data stream DA2 one bit at a time in response to each clock cycle of the clock signal CK1. As a result, the data serialization circuit 210 can realize 8-to-1 data serialization in the D-PHY mode.

In a C-PHY mode, the frequency divider 212 may divide the frequency of the clock signal CK1 by the adjustable division factor equal to seven (i.e. N=7) to generate the clock signal CK2. The serializer 214 may receive seven bits of the M-bit data signal DA1 at a time in response to each clock cycle of the clock signal CK2, and output the serial data stream DA2 one bit at a time in response to each clock cycle of the clock signal CK1. The data serialization circuit 210 can realize 7-to-1 data serialization in the C-PHY mode.

It is worth noting that the data serialization circuit 210 can be applied to other types of multi-mode transmitter circuit capable of supporting multiple interface specifications without departing form the scope of the present disclosure. In some embodiments, the transmitter circuit 100 shown in FIG. 1 can be implemented as a sub-LVDS/LVDS combo transmitter circuit. The data serialization circuit 210 may receive, for example, an 8-bit data signal serving as the M-bit data signal DA1 (M=8). In a sub-LVDS mode, the frequency divider 212 may divide the frequency of the clock signal CK1 by the adjustable division factor equal to eight (i.e. N=M) to generate the clock signal CK2. The serializer 214 may receive the M-bit data signal DA1 according to the clock signal CK2 whose frequency is equal to one eighth of the frequency of the clock signal CK1, and output the serial data stream DA2 according to the clock signal CK1. In a LVDS mode, the frequency divider 212 may divide the frequency of the clock signal CK1 by the adjustable division factor equal to seven (i.e. N=7) to generate the clock signal CK2. The serializer 214 may receive the M-bit data signal DA1 according to the clock signal CK2 whose frequency is equal to one seventh of the frequency of the clock signal CK1, and output the serial data stream DA2 according to the clock signal CK1.

In some other embodiments, the transmitter circuit 100 shown in FIG. 1 can be implemented as an HDMI transmitter circuit or an M-PHY transmitter circuit. The data serialization circuit 210 can be configured to perform 10-to-1 data serialization by dividing the frequency of the clock signal CK1, or a bit rate clock, by the adjustable division factor equal to 10 to generate the clock signal CK2. For example, the data serialization circuit 210 may receive a 10-bit data signal serving as the M-bit data signal DA1 (M=10). In a mode of operation, the frequency divider 212 may divide the frequency of the clock signal CK1 by the adjustable division factor equal to 10 (i.e. N=M) to generate the clock signal CK2. The serializer 214 may receive the M-bit data signal DA1 according to the clock signal CK2 whose frequency is one tenth of the frequency of the clock signal CK1, and output the serial data stream DA2 according to the clock signal CK1. As another example, the bit width of the M-bit data signal DA1 may be greater than ten (M>10). In a mode of operation, the frequency divider 212 may divide the clock signal CK1 by the adjustable division factor equal to 10 (i.e. N=10<M) to generate the clock signal CK2. The serializer 214 may receive ten bits of the M-bit data signal DA1 one at a time according to the clock signal CK2, and output the serial data stream DA2 according to the clock signal CK1.

Figure 3:
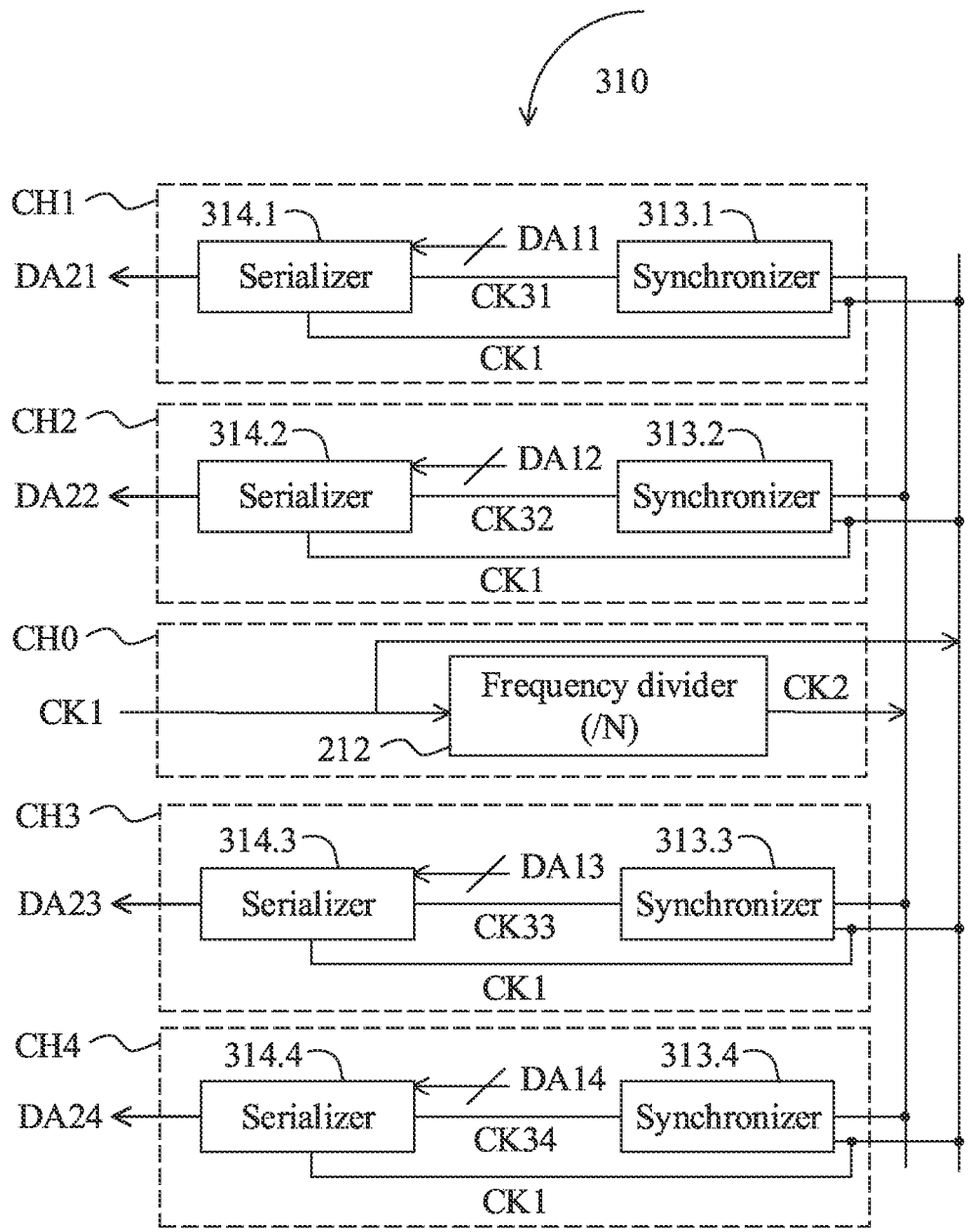
FIG. 3 illustrates another implementation of the data serialization circuit shown in FIG. 1 in accordance with some embodiments of the present disclosure.

The circuit structure shown in FIG. 2 can be applied to multi-channel data serialization. FIG. 3 illustrates another implementation of the data serialization circuit 110 shown in FIG. 1 in accordance with some embodiments of the present disclosure. The circuit structure shown in FIG. 3 is similar/identical to that shown in FIG. 2 except that, for example, the data serialization circuit 310 utilizes a synchronizer in each local channel to implement multi-channel data serialization. The data serialization circuit 310 includes, but is not limited to, the frequency divider 212 shown in FIG. 2, a plurality of synchronizers 313.1-313.4 and a plurality of serializers 314.1-314.4. Each of the serializers 3141-3144 can be implemented using the serializer 214 shown in FIG. 2. In the present embodiment, the frequency divider 212 may be disposed in a global channel CH0. One of the serializers 314.1-314.4 and a corresponding synchronizer may be disposed in a corresponding local channel, i.e. one of local channels CH1-CH4.

Each of the synchronizers 313.1-313.4 is coupled to the frequency divider 212 and a corresponding one of the serializers 314.1-314.4. Each of the synchronizers 313.1-313.4 can be configured to synchronize the clock signal CK2 according to the clock signal CK1, and accordingly output a clock signal which is synchronized with the clock signal CK1. As shown in FIG. 3, the synchronizers 313.1-313.4 can be configured to output a plurality of clock signals CK31-CK34, respectively, which can be synchronized with the clock signal CK1 and hence synchronized with each other. In some embodiments, at least one of the synchronizers 313.1-313.4 may be implemented using a D-type flip-flop.

Each of the serializers 314.1-314.4 can be clocked by a clock signal synchronized with the clock signal CK1 to receive an M-bit data signal, e.g. one of M-bit data signals DA11-DA14. Also, each of the serializers 314.1-314.4 can be clocked by the clock signal CK1 to convert the M-bit data signal to a serial data stream, e.g. one of serial data streams DA21-DA24.

In operation, the frequency divider 212 in the global channel CH0 may divide the frequency of the clock signal CK1, e.g. a bit rate clock, to generate the clock signal CK2, e.g. a byte rate clock. Each of the synchronizers 313.1-313.4 can generate a synchronized version of the clock signal CK2, i.e. one of the clock signals CK31-CK34 which are synchronized with each other. The serializers 314.1-314.4 can be clocked by the clock signals CK31-CK34 to serialize the M-bit data signals DA11-DA14, respectively. Respective data conversion operations of the serializers 314.1-314.4 can therefore be synchronized with each other.

The circuit structure shown in FIG. 3 is provided for illustrative purposes, and is not intended to limit the scope of the present disclosure. For example, different numbers of local channels may be provided according to design requirements. As long as a synchronizer is utilized to trigger data serialization with the use of a synchronized version of a frequency-divided clock signal outputted from a multi-mode frequency divider, associated modifications and alternatives fall with the scope of the present disclosure.

With the use of the proposed multi-mode data serialization scheme, data signals compliant with different interface specifications can be successfully received and processed. Compared with a transmitter circuit employing data serialization circuits for different interface standards, a transmitter circuit utilizing the proposed multi-mode data serialization scheme can achieve operational flexibility and have a relatively small circuit area, thereby reducing manufacturing costs.

Figure 4:
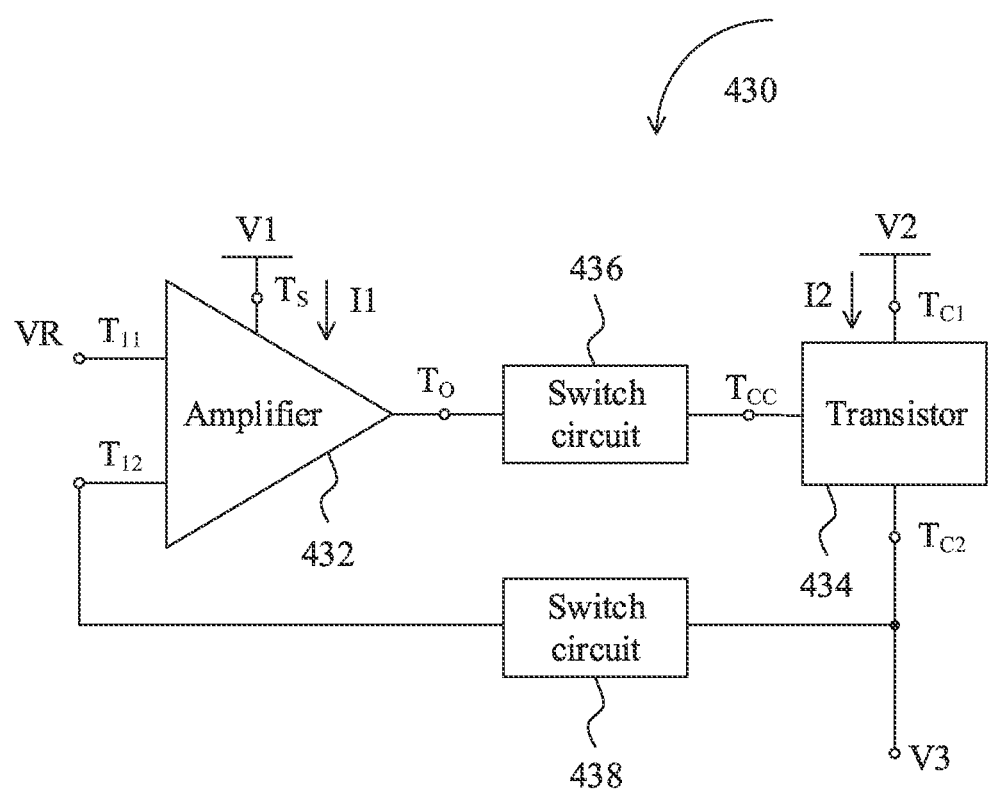
FIG. 4 illustrates an implementation of at least a portion of the voltage regulator circuit shown in FIG. 1 in accordance with some embodiments of the present disclosure.

FIG. 4 illustrates an implementation of at least a portion of the voltage regulator circuit 130 shown in FIG. 1 in accordance with some embodiments of the present disclosure. The voltage regulator circuit 430 is configured to output a regulated voltage, i.e. the supply voltage V3, according to the supply voltages V1 and V2. The voltage regulator circuit 430 may include an amplifier 432, a transistor 434 and a plurality of switch circuits 436 and 438. The amplifier 432 includes a plurality of input terminals $T_{I1}$ and $T_{I2}$, an output terminal $T_O$ and a supply terminal $T_S$. The input terminal $T_{I1}$ is coupled to a reference voltage VR, and the supply terminal $T_S$ is coupled to the supply voltage V1. In the present embodiment, the amplifier 432 can be implemented as, but is not limited to, an error amplifier.

The transistor 434 includes a plurality of connection terminals $T_{C1}$ and $T_{C2}$, and a control terminal $T_{CC}$. The connection terminal $T_{C1}$ is coupled to the supply voltage V2. For example, the transistor 434 may be an n-channel field-effect transistor. The connection terminals $T_{C1}$ and $T_{C2}$ may be a drain terminal and a source terminal of the n-channel field-effect transistor, respectively. The control terminal $T_{CC}$ is a gate terminal of the n-channel field-effect transistor. As another example, the transistor 434 may be a p-channel field-effect transistor. The connection terminals $T_{C1}$ and $T_{C2}$ may be a source terminal and a drain terminal of the p-channel field-effect transistor, respectively. The control terminal $T_{CC}$ is a gate terminal of the p-channel field-effect transistor. In the present embodiment, the amplifier 432 can be implemented as, but is not limited to, a power transistor which is rated at high voltage and current.

The switch circuit 436 is configured to selectively couple the output terminal $T_O$ to the control terminal $T_{CC}$. The switch circuit 438 is configured to selectively couple the input terminal $T_{I2}$ to the connection terminal $T_{C2}$. In operation, when the output terminal $T_O$ is coupled to the control terminal $T_{CC}$ through the switch circuit 436, and the input terminal $T_{I2}$ is coupled to the connection terminal $T_{C2}$ through the switch circuit 438, the connection terminal $T_{C2}$ is arranged to output the supply voltage V3. The supply voltage V3 may be at a voltage level less than or equal to a voltage level of the supply voltage V2. Power consumption of the voltage regulator circuit 430 will be V1×I1+V2×I2, where I1 and I2 represent currents supplied to the amplifier 432 and the transistor 434, respectively. In the present embodiment, the voltage level of the supply voltage V2 supplied to the transistor 434 may be less than a voltage level of the supply voltage V1 supplied to the amplifier 432. The power consumption can be reduced as compared to power consumption in an embodiment where the voltage level of the supply voltage V2 is equal to the voltage level of the supply voltage V1, which can be represented below.

$$V1 \times I1 + V2 \times I2 < V1 \times I1 + V1 \times I2 = V1 \times (I1 + I2).$$

Consider an example in which a transmitter circuit the voltage regulator circuit 430 is applied to, e.g. the transmitter circuit 100 shown in FIG. 1, operates in a D-PHY mode. The supply voltage V1 is 2.5 volts, the current I1 is 0.1 mA, and the current I2 is 2.1 mA. In an embodiment where the voltage level of the supply voltage V2 is equal to the voltage level of the supply voltage V1, the power consumption would be 2.5×(0.1+2.1)=5.5 mW. In another embodiment where the voltage level of the supply voltage V2 is set to 0.8 volts rather than 2.5 volts, the power consumption will be 2.5×0.1+0.8×2.1=1.93 mW, which is 35% of 5.5 mV.

Figure 5:
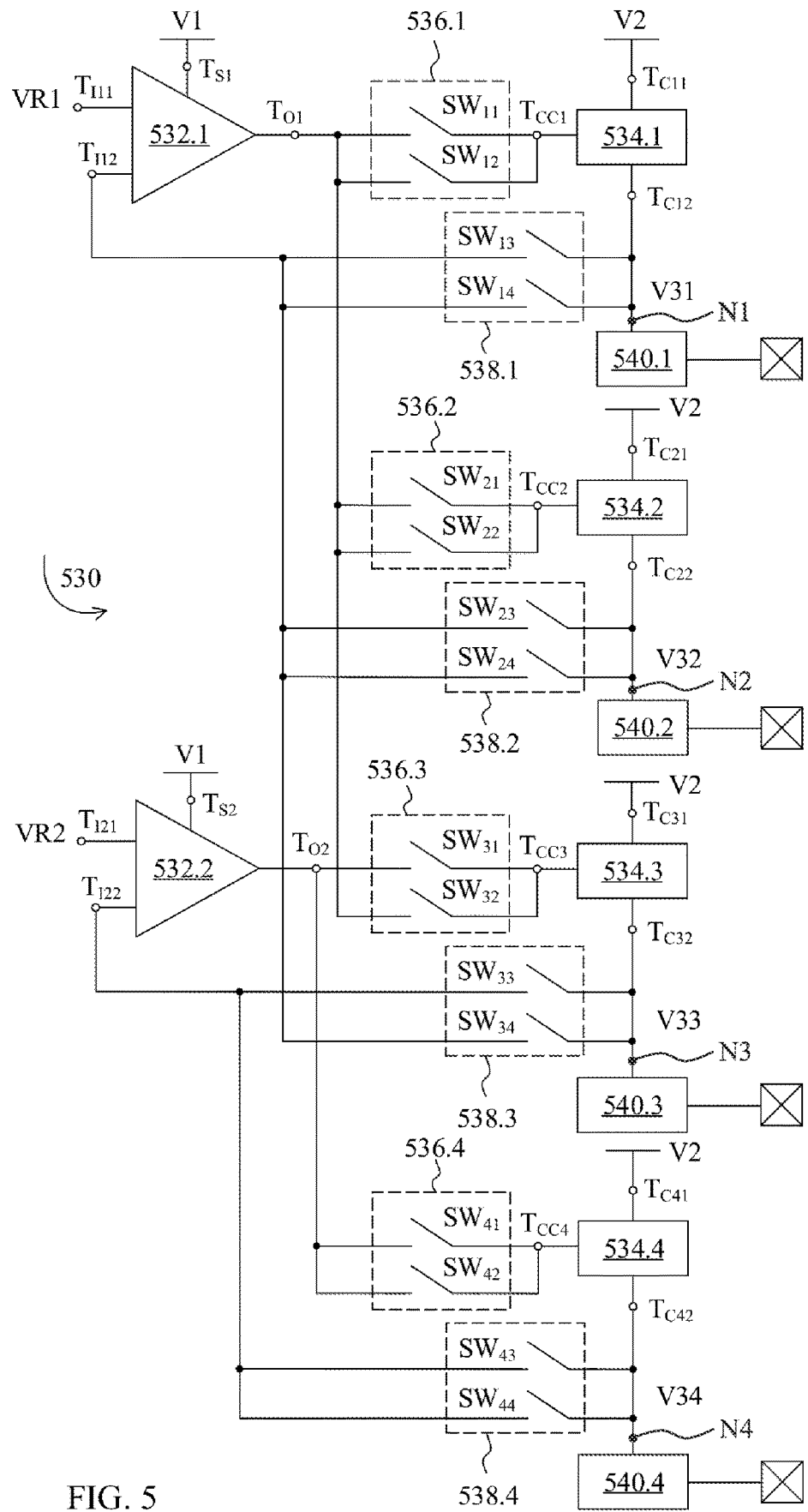
FIG. 5 illustrates another implementation of at least a portion of the voltage regulator circuit shown in FIG. 1 in accordance with some embodiments of the present disclosure.

It is worth noting that the circuit structure shown in FIG. 4 can be employed to realize a configurable voltage regulator circuit. Referring to FIG. 5, another implementation of at least a portion of the voltage regulator circuit 130 shown in FIG. 1 is illustrated in accordance with some embodiments of the present disclosure. The voltage regulator circuit 530 includes a plurality of amplifiers 532.1 and 532.2, and a plurality of transistors 534.1-534.4. Each of the amplifiers 532.1 and 532.2 can be implemented using the amplifier 432 shown in FIG. 4. Each of the transistors 534.1-534.4 can be implemented using the transistor 434 shown in FIG. 4. The voltage regulator circuit 530 can act as a group of voltage regulators such as a group of low-dropout (LDO) regulators. At least one of the amplifiers 532.1 and 532.2 can operate together with one or more of the transistors 534.1-534.4 to implement one or more configurable voltage regulators, thereby providing one or more of the supply voltages V31-V34 for one or more of the driver circuits 540.1-540.4. Each of the driver circuits 540.1-540.4 can represent an embodiment of the driver circuit 140 shown in FIG. 1. Each of the driver circuits 540.1-540.4 can receive a corresponding supply voltage through a node coupled to a corresponding transistor, i.e. one of the nodes N1-N4.

In the present embodiment, each of the supply terminal $T_{S1}$ of the amplifier 532.1 and the supply terminal $T_{S2}$ of the amplifier 532.2 is coupled to the supply voltage V1. The input terminal $T_{I11}$ of the amplifier 532.1 is coupled to a reference voltage VR1, and the input terminal $T_{I21}$ of the amplifier 532.2 is coupled to a reference voltage VR2. The reference voltages VR1 and VR2 may be at a same voltage level. In some embodiments, the reference voltage VR2 may be at a voltage level different from that of the reference voltage VR1 without departing from the scope of the present disclosure.

With regard to the transistors 534.1-534.4, each of the connection terminals $T_{C11}$, $T_{C21}$, $T_{C31}$ and $T_{C41}$ is coupled to the supply voltage V2, a voltage level of which may be less than that of the supply voltage V1. At least one of the transistors 534.1-534.4 can be coupled to one of the amplifiers 532.1 and 532.2 in a mode of the voltage regulator circuit 530, while coupled to the other of the amplifiers 532.1 and 532.2 in another mode of the voltage regulator circuit 530. For example, the control terminal $T_{CC3}$ of the transistor 534.3 is selectively coupled to one of the output terminal $T_{O1}$ of the amplifier 532.1 and the output terminal $T_{O2}$ of the amplifier 532.2, and the connection terminal $T_{C32}$ of the transistor 534.3 is selectively coupled to one of the input terminal $T_{I12}$ of the amplifier 532.1 and the input terminal $T_{I22}$ of the amplifier 532.2. The driver circuit 540.3 can be selectively coupled to one of the input terminal $T_{I12}$ of the amplifier 532.1 and the input terminal $T_{I22}$ of the amplifier 532.2 through the node N3 coupled to the connection terminal $T_{C32}$ to receive the supply voltage V33 from the node N3. In the present embodiment, when the control terminal $T_{CC3}$ of the transistor 534.3 is coupled to the output terminal $T_{O1}$ of the amplifier 532.1, the connection terminal $T_{C32}$ of the transistor 534.3 is coupled to the input terminal $T_{I12}$ of the amplifier 532.1 to output the supply voltage V33, i.e. a regulated voltage, in response to the reference voltage VR1 and the supply voltage V2. When the control terminal $T_{CC3}$ of the transistor 534.3 is coupled to the output terminal $T_{O2}$ of the amplifier 532.2, the connection terminal $T_{C32}$ of the transistor 534.3 is coupled to the input terminal $T_{I22}$ of the amplifier 532.2 to output the supply voltage V33 in response to the reference voltage VR2 and the supply voltage V2.

In addition, the control terminal $T_{CC1}$ of the transistor 534.1 can be selectively coupled to the output terminal $T_{O1}$ of the amplifier 532.1, and the connection terminal $T_{C12}$ of the transistor 534.1 can be selectively coupled to the input terminal $T_{I12}$ of the amplifier 532.1. The control terminal $T_{CC2}$ of the transistor 534.2 can be selectively coupled to the output terminal $T_{O1}$ of the amplifier 532.1, and the connection terminal $T_{C22}$ of the transistor 534.2 can be selectively coupled to the input terminal $T_{I12}$ of the amplifier 532.1. The control terminal $T_{CC4}$ of the transistor 534.4 can be selectively coupled to the output terminal $T_{O2}$ of the amplifier 532.2, and the connection terminal $T_{C42}$ of the transistor 534.4 can be selectively coupled to the input terminal $T_{I22}$ of the amplifier 532.2.

The voltage regulator circuit 530 may further include a plurality of switch circuits 536.1-536.4 and 538.1-538.4. The switch circuit 536.1 is configured to selectively couple the output terminal $T_{O1}$ of the amplifier 532.1 to the control terminal $T_{CC1}$ of the transistor 534.1. The switch circuit 538.1 is configured to selectively couple the input terminal $T_{I12}$ of the amplifier 532.1 to the connection terminal $T_{C12}$ of the transistor 534.1. By way of example but not limitation, the switch circuit 536.1 may be implemented using two switches $SW_{11}$ and $SW_{12}$. When one of the switches $SW_{11}$ and $SW_{12}$ is switched on, the other can be switched off. The switch circuit 538.1 may be implemented using two switches $SW_{13}$ and $SW_{14}$. When one of the switches $SW_{13}$ and $SW_{14}$ is switched on, the other can be switched off.

Similarly, the switch circuit 536.2, configured to selectively couple the output terminal $T_{O1}$ of the amplifier 532.1 to the control terminal $T_{CC2}$ of the transistor 534.2, can be implemented using two switches $SW_{21}$ and $SW_{22}$. When one of the switches $SW_{21}$ and $SW_{22}$ is switched on, the other can be switched off. The switch circuit 538.2, configured to selectively couple the input terminal $T_{I12}$ of the amplifier 532.1 to the connection terminal $T_{C22}$ of the transistor 534.2, can be implemented using two switches $SW_{23}$ and $SW_{24}$. When one of the switches $SW_{23}$ and $SW_{24}$ is switched on, the other can be switched off. The switch circuit 536.4, configured to selectively couple the output terminal $T_{O2}$ of the amplifier 532.2 to the control terminal $T_{CC4}$ of the transistor 534.4, can be implemented using two switches $SW_{41}$ and $SW_{42}$. When one of the switches $SW_{41}$ and $SW_{42}$ is switched on, the other can be switched off. The switch circuit 538.4, configured to selectively couple the input terminal $T_{I22}$ of the amplifier 532.2 to the connection terminal $T_{C42}$ of the transistor 534.4, can be implemented using two switches $SW_{43}$ and $SW_{44}$. When one of the switches $SW_{43}$ and $SW_{44}$ is switched on, the other can be switched off.

In regard to the transistor 534.3, the switch circuit 536.3 is configured to selectively couple one of the output terminal $T_{O1}$ of the amplifier 532.1 and the output terminal $T_{O2}$ of the amplifier 532.2 to the control terminal $T_{CC3}$ of the transistor 534.3. The switch circuit 538.3 is configured to selectively couple one of the input terminal $T_{I12}$ of the amplifier 532.1 and the input terminal $T_{I22}$ of the amplifier 532.2 to the connection terminal $T_{C32}$ of the transistor 534.3. By way of example but not limitation, the switch circuit 536.3 may be implemented using two switches $SW_{31}$ and $SW_{32}$. The switch $SW_{31}$ is selectively coupled between the output terminal $T_{O2}$ and the control terminal $T_{CC3}$. The switch $SW_{32}$ is selectively coupled between the output terminal $T_{O1}$ and the control terminal $T_{CC3}$. When one of the switches $SW_{31}$ and $SW_{32}$ is switched on, the other can be switched off. The switch circuit 538.1 may be implemented using two switches $SW_{13}$ and $SW_{14}$. The switch $SW_{33}$ is selectively coupled between the input terminal $T_{I22}$ and the connection terminal $T_{C32}$. The switch $SW_{34}$ is selectively coupled between the input terminal $T_{I12}$ and the connection terminal $T_{C32}$. When one of the switches $SW_{33}$ and $SW_{34}$ is switched on, the other can be switched off.

Figure 6A:
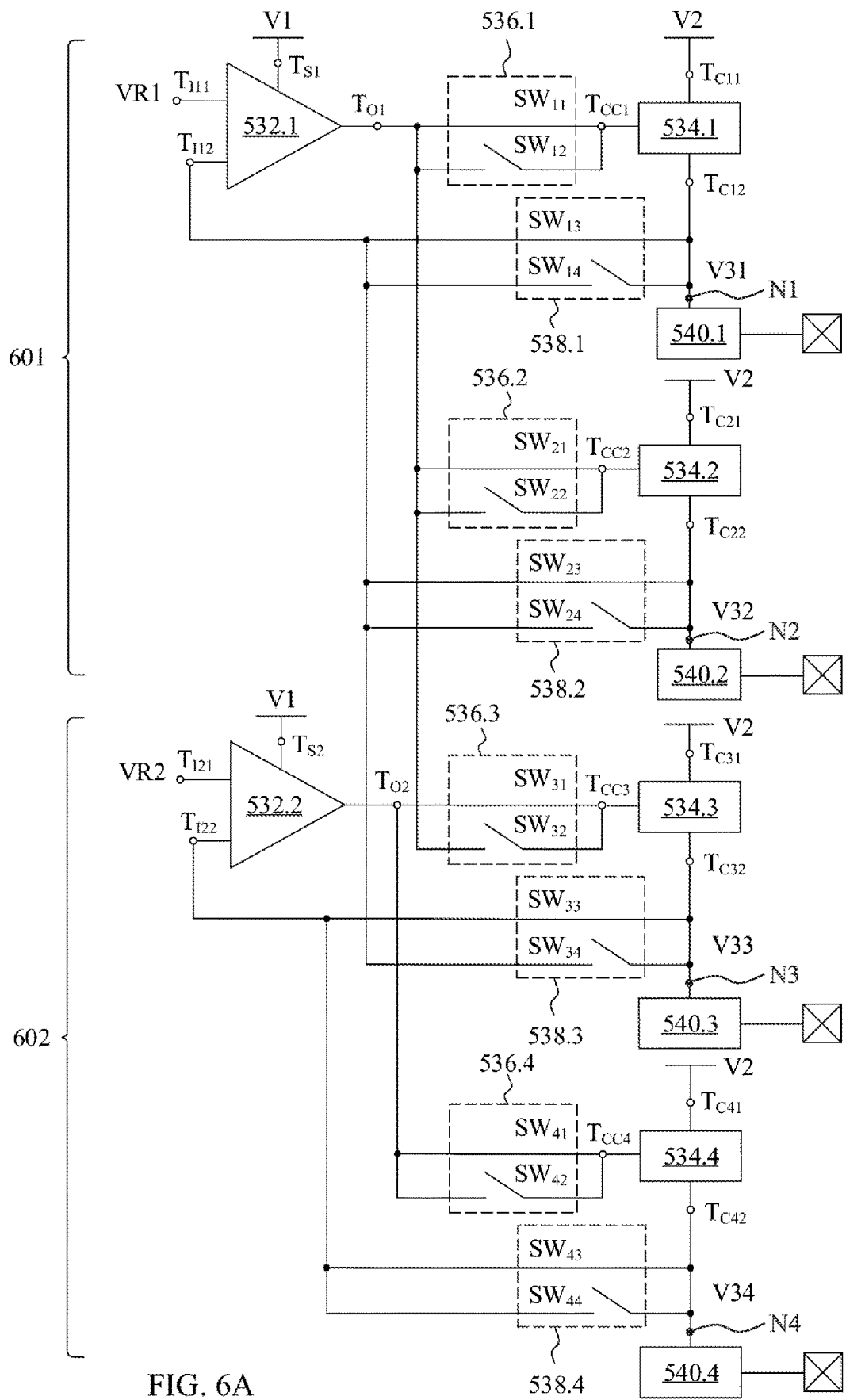
FIG. 6A and FIG. 6B illustrate exemplary operation in different modes of the voltage regulator circuit shown in FIG. 5 in accordance with some embodiments of the present disclosure.

FIG. 6A is a diagram illustrating exemplary operation in a first mode of the voltage regulator circuit 530 shown in FIG. 5 in accordance with some embodiments of the present disclosure. In the present embodiment, the voltage regulator circuit 530 operating in the first mode can support MIPI D-PHY signaling. In operation, each of the switches $SW_{11}$, $SW_{13}$, $SW_{21}$, $SW_{23}$, $SW_{31}$, $SW_{33}$, $SW_{41}$ and $SW_{43}$ is switched on. Each of the switches $SW_{12}$, $SW_{14}$, $SW_{22}$, $SW_{24}$, $SW_{32}$, $SW_{34}$, $SW_{42}$ and $SW_{44}$ is switched off. The amplifier 532.1 can operate together with the transistors 534.1 to implement a voltage regulator, which provides the supply voltage V31 to the driver circuit 540.1. Also, the amplifier 532.1 can operate together with the transistors 534.2 to implement a voltage regulator, which provides the supply voltage V32 to the driver circuit 540.2. The amplifier 532.1, the transistors 534.1 and 534.2, the switch circuits 536.1, 536.2, 538.1 and 538.2, and the driver circuits 540.1 and 540.2 can be configured as at least a portion of a D-PHY lane 601. Similarly, the amplifier 532.2 can operate together with the transistors 534.3 to implement a voltage regulator, which provides the supply voltage V33 to the driver circuit 540.3. The amplifier 532.2 can also operate together with the transistors 534.4 to implement a voltage regulator, which provides the supply voltage V34 to the driver circuit 540.4. The amplifier 532.2, the transistors 534.3 and 534.4, the switch circuits 536.3, 536.4, 538.3 and 538.4, and the driver circuits 540.3 and 540.4 can be configured as at least a portion of another D-PHY lane 602.

As the circuit configuration shown in FIG. 6A can implement two D-PHY lanes 601 and 602, the voltage regulator circuit 530 can support a 1D1C lane configuration compliant with the MIPI D-PHY specification. The voltage regulator circuit 530 can have a simplified design to support MIPI D-PHY signaling since a single amplifier is utilized to provide a constant current for each D-PHY lane.

Figure 6B:
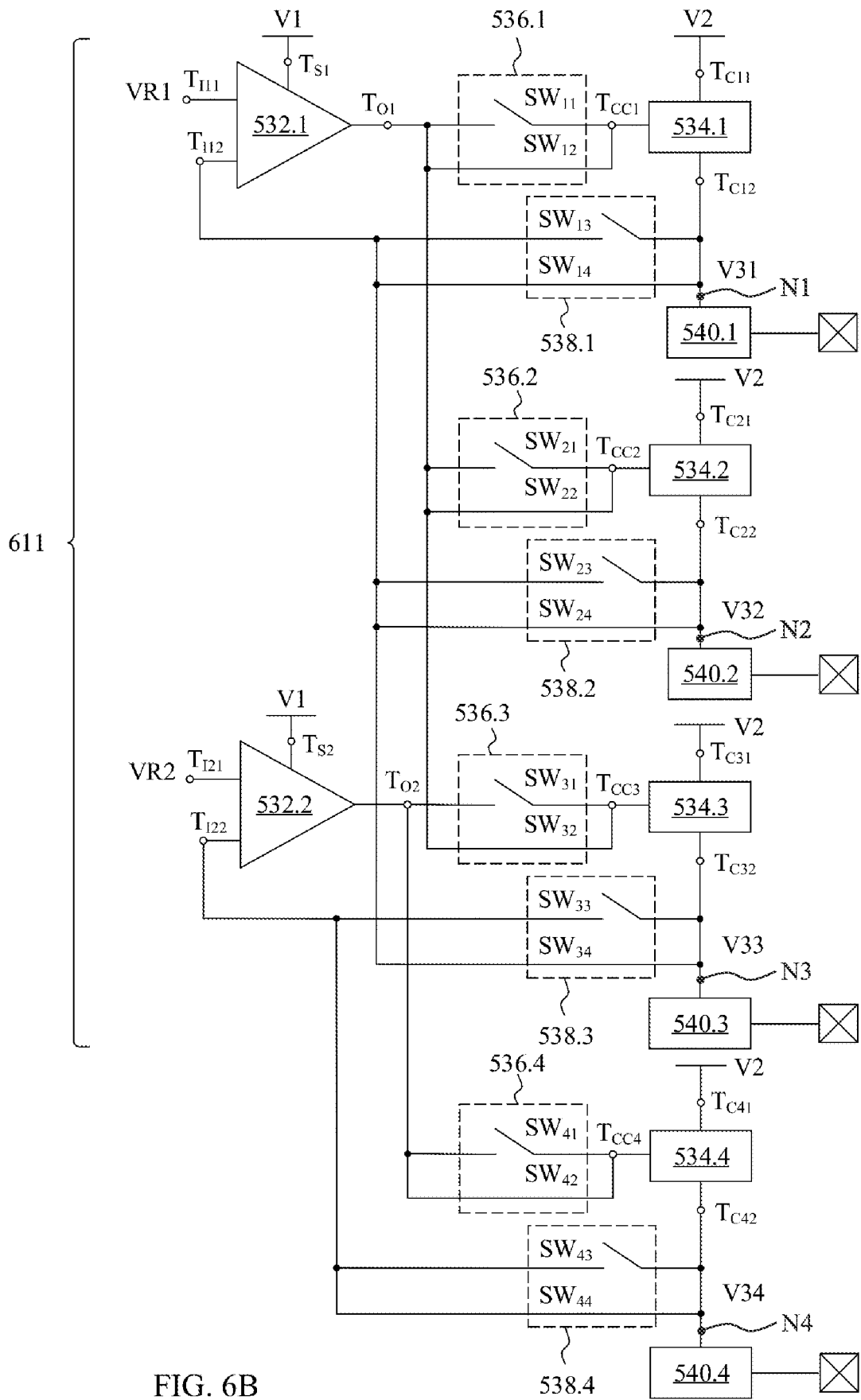

FIG. 6B is a diagram illustrating exemplary operation in a second mode of the voltage regulator circuit 530 shown in FIG. 5 in accordance with some embodiments of the present disclosure. In the present embodiment, the voltage regulator circuit 530 operating in the second mode can support MIPI C-PHY signaling. In operation, each of the switches $SW_{11}$, $SW_{13}$, $SW_{21}$, $SW_{23}$, $SW_{31}$, $SW_{33}$, $SW_{41}$ and $SW_{43}$ is switched off. Each of the switches $SW_{12}$, $SW_{14}$, $SW_{22}$, $SW_{24}$, $SW_{32}$, $SW_{34}$, $SW_{42}$ and $SW_{44}$ is switched on. As a result, the amplifier 532.1, shared by the transistors 534.1-534.3, can operate together with each of the transistors 534.1-534.3 to implement a voltage regulator. The amplifier 532.1, the transistors 534.1-534.3, the switch circuits 536.1-536.3 and 538.1-538.3, and the driver circuits 540.1-540.3 can be configured as at least a portion of a C-PHY trio 611. The voltage regulator circuit 530 can have a simplified design to support MIPI C-PHY signaling since a single amplifier is utilized to provide a constant current for a C-PHY trio.

Figure 7:
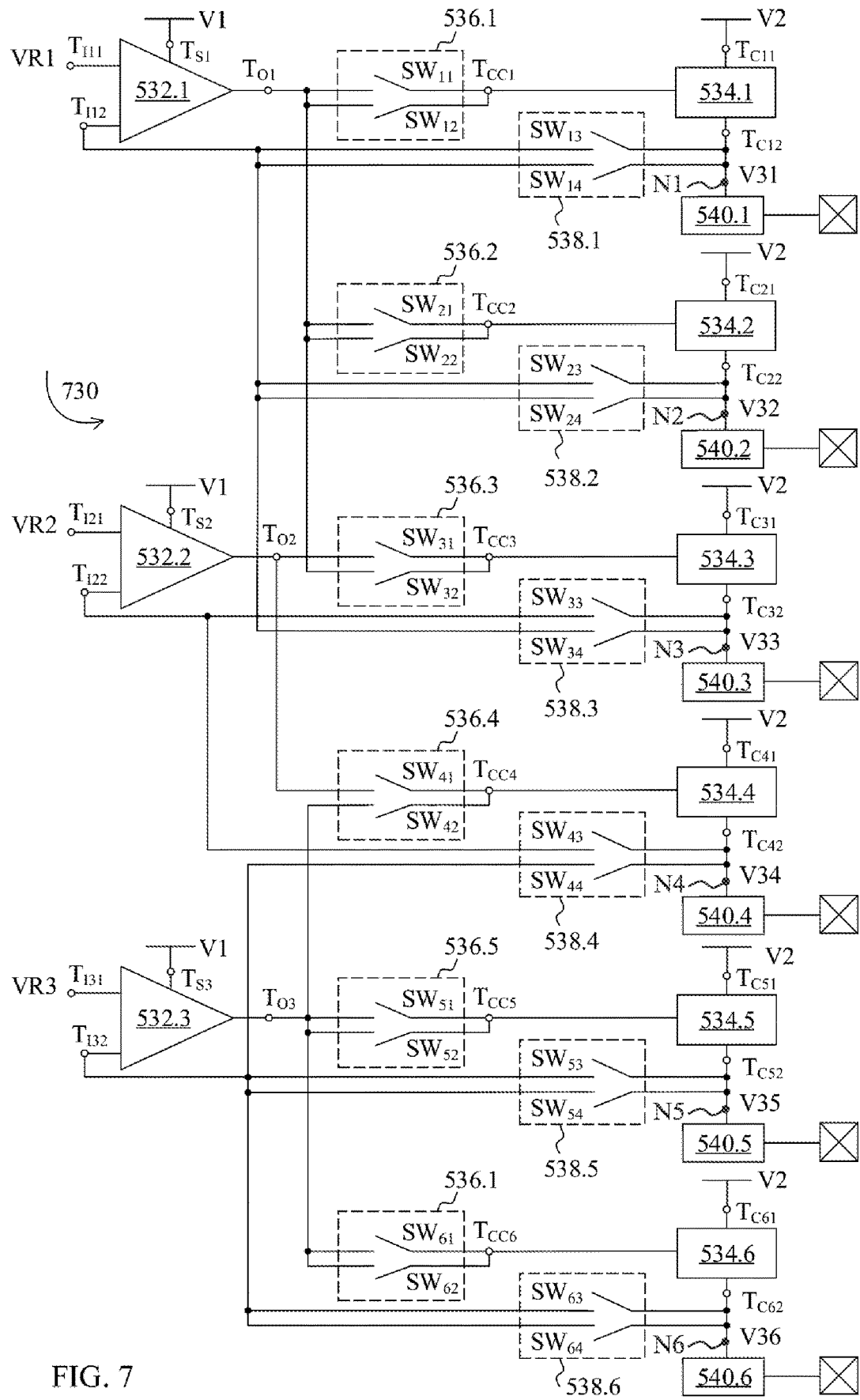
FIG. 7 illustrates another implementation of at least a portion of the voltage regulator circuit shown in FIG. 1 in accordance with some embodiments of the present disclosure.

FIG. 7 illustrates another implementation of at least a portion of the voltage regulator circuit 130 shown in FIG. 1 in accordance with some embodiments of the present disclosure. The circuit structure shown in FIG. 7 is identical/similar to that shown in FIG. 5 except that, for example, the voltage regulator circuit 730 further includes an amplifier 532.3 and a plurality of transistors 534.5 and 534.6. In the present embodiment, the supply terminal $T_{S3}$ of the amplifier 532.3 is coupled to the supply voltage V1. The input terminal $T_{I31}$ of the amplifier 532.3 is coupled to a reference voltage VR3. The reference voltages VR1-VR3 may be at a same voltage level. In some embodiments, one of the reference voltages VR1-VR3 may be at a voltage level different from that of another of the reference voltages VR1-VR3 without departing from the scope of the present disclosure.

With regard to the transistors 534.5 and 534.6, each of the connection terminals $T_{C51}$ and $T_{C61}$ is coupled to the supply voltage V2. The control terminal $T_{CC5}$ of the transistor 534.5 can be selectively coupled to the output terminal $T_{O3}$ of the amplifier 532.3, and the connection terminal $T_{C52}$ of the transistor 534.5 can be selectively coupled to the input terminal $T_{I32}$ of the amplifier 532.3. The control terminal $T_{CC6}$ of the transistor 534.6 can be selectively coupled to the output terminal $T_{O3}$ of the amplifier 532.3, and the connection terminal $T_{C62}$ of the transistor 534.6 can be selectively coupled to the input terminal $T_{I32}$ of the amplifier 532.3.

In the present embodiment, the voltage regulator circuit 730 may further include a plurality of switch circuits 536.5, 536.6, 538.5 and 538.6. The switch circuit 536.5 is configured to selectively couple the output terminal $T_{O3}$ of the amplifier 532.3 to the control terminal $T_{CC5}$ of the transistor 534.5. The switch circuit 538.5 is configured to selectively couple the input terminal $T_{I32}$ of the amplifier 532.3 to the connection terminal $T_{C52}$ of the transistor 534.5. By way of example but not limitation, the switch circuit 536.5 may be implemented using two switches $SW_{51}$ and $SW_{52}$. When one of the switches $SW_{51}$ and $SW_{52}$ is switched on, the other can be switched off. The switch circuit 538.5 may be implemented using two switches $SW_{53}$ and $SW_{54}$. When one of the switches $SW_{53}$ and $SW_{54}$ is switched on, the other can be switched off.

Similarly, the switch circuit 536.6, configured to selectively couple the output terminal $T_{O3}$ of the amplifier 532.3 to the control terminal $T_{CC6}$ of the transistor 534.6, can be implemented using two switches $SW_{61}$ and $SW_{62}$. When one of the switches $SW_{61}$ and $SW_{62}$ is switched on, the other can be switched off. The switch circuit 538.6, configured to selectively couple the input terminal $T_{I32}$ of the amplifier 532.3 to the connection terminal $T_{C62}$ of the transistor 534.6, can be implemented using two switches $SW_{63}$ and $SW_{64}$. When one of the switches $SW_{63}$ and $SW_{64}$ is switched on, the other can be switched off.

It is worth noting that, in the embodiment shown in FIG. 7, the transistor 534.4 can be coupled to one of the amplifiers 532.2 and 532.3 in a mode of operation of the voltage regulator circuit 730, while coupled to the other of the amplifiers 532.2 and 532.3 in another mode of the voltage regulator circuit 730. For example, the control terminal $T_{CC4}$ of the transistor 534.4 can be selectively coupled to one of the output terminal $T_{O2}$ of the amplifier 532.2 and the output terminal $T_{O3}$ of the amplifier 532.3. Also, the connection terminal $T_{C42}$ of the transistor 534.4 can be selectively coupled to one of the input terminal $T_{I22}$ of the amplifier 532.2 and an input terminal $T_{I32}$ of the amplifier 532.3.

In the present embodiment, when the control terminal $T_{CC3}$ of the transistor 534.3 is coupled to the output terminal $T_{O1}$ of the amplifier 532.1, the control terminal $T_{CC4}$ of the transistor 534.4 is coupled to the output terminal $T_{O3}$ of the amplifier 532.3, and the connection terminal $T_{C42}$ of the transistor 534.4 is coupled to the input terminal $T_{I32}$ of the amplifier 532.3 to output the supply voltage V34, i.e. a regulated voltage, in response to the reference voltage VR3 and the supply voltage V2. When the control terminal $T_{CC3}$ of the transistor 534.3 is coupled to the output terminal $T_{O2}$ of the second amplifier 532.2, the control terminal $T_{CC4}$ of the transistor 534.4 is coupled to the output terminal $T_{O2}$ of the second amplifier 532.2, and the connection terminal $T_{C42}$ of the transistor 534.4 is coupled to the input terminal $T_{I22}$ of the amplifier 532.2 to output the supply voltage V34 in response to the reference voltage VR2 and the supply voltage V2.

Figure 8A:
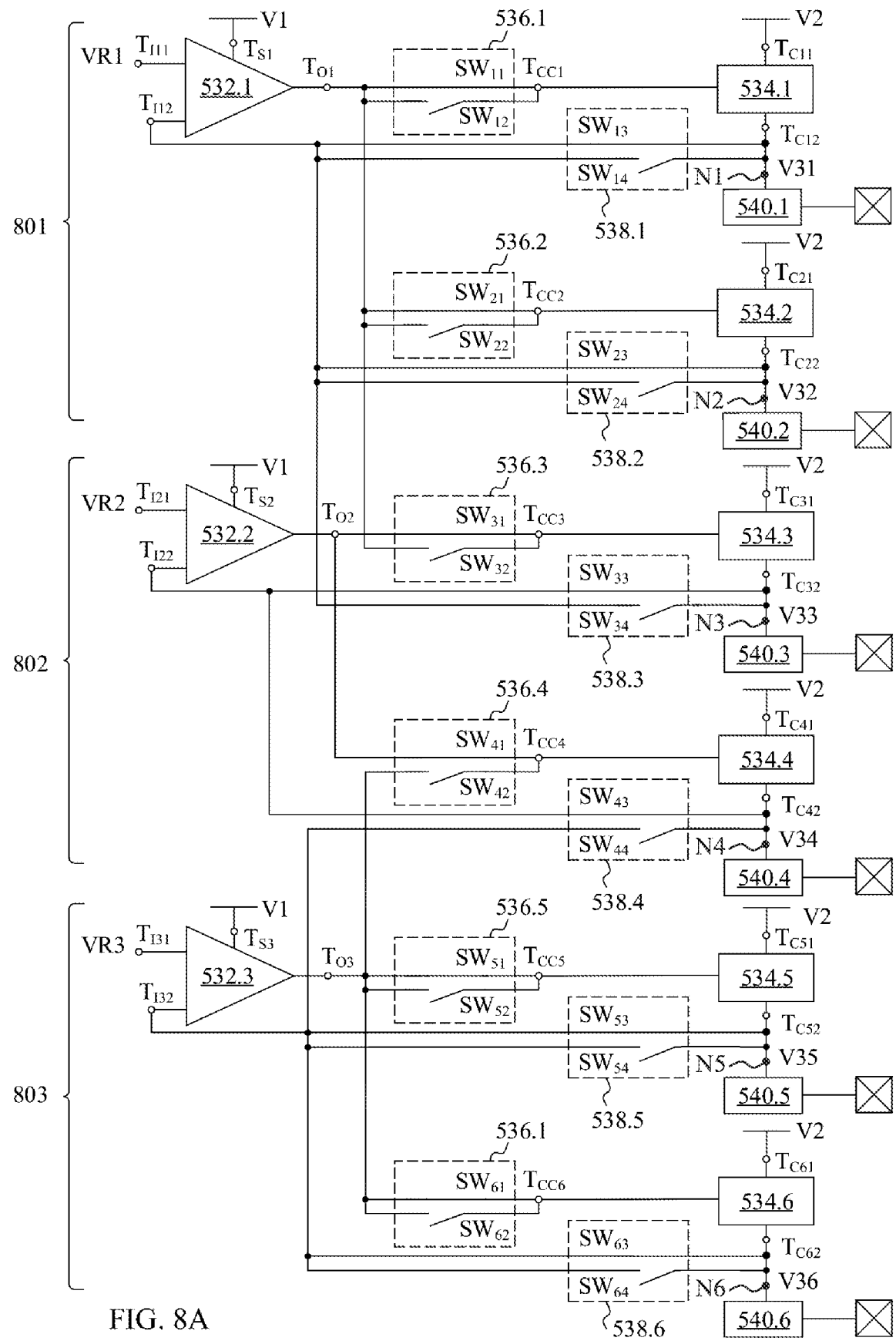
FIG. 8A and FIG. 8B illustrate exemplary operation in different modes of the voltage regulator circuit shown in FIG. 7 in accordance with some embodiments of the present disclosure.

FIG. 8A is a diagram illustrating exemplary operation in a first mode of the voltage regulator circuit 730 shown in FIG. 7 in accordance with some embodiments of the present disclosure. In the present embodiment, the voltage regulator circuit 730 operating in the first mode can support MIPI D-PHY differential signaling. In operation, each of the switches $SW_{11}$, $SW_{13}$, $SW_{21}$, $SW_{23}$, $SW_{31}$, $SW_{33}$, $SW_{41}$, $SW_{43}$, $SW_{51}$, $SW_{53}$, $SW_{61}$ and $SW_{63}$ is switched on. Each of the switches $SW_{12}$, $SW_{14}$, $SW_{22}$, $SW_{24}$, $SW_{32}$, $SW_{34}$, $SW_{42}$, $SW_{44}$, $SW_{52}$, $SW_{54}$, $SW_{62}$ and $SW_{64}$ is switched off. The amplifier 532.1, be shared by the transistors 534.1 and 534.2, can operate together with each of the transistors 534.1 and 534.2 to implement a voltage regulator, which provides the supply voltage V31/V32 to the driver circuit 540.1/540.2. The amplifier 532.2, be shared by the transistors 534.3 and 534.4, can operate together with each of the transistors 534.3 and 534.4 to implement a voltage regulator, which provides the supply voltage V33/V34 to the driver circuit 540.3/540.4. The amplifier 532.3, be shared by the transistors 534.5 and 534.6, can operate together with each of the transistors 534.5 and 534.6 to implement a voltage regulator, which provides the supply voltage V35/V36 to the driver circuit 540.5/540.6 through the node N5/N6. As a result, the circuit configuration shown in FIG. 8A can implement three D-PHY lanes 801-803. The voltage regulator circuit 730 can utilize a simplified design, where a single amplifier is utilized to provide a constant current for each D-PHY lane, to support a 2D1C lane configuration compliant with the MIPI D-PHY specification.

Figure 8B:
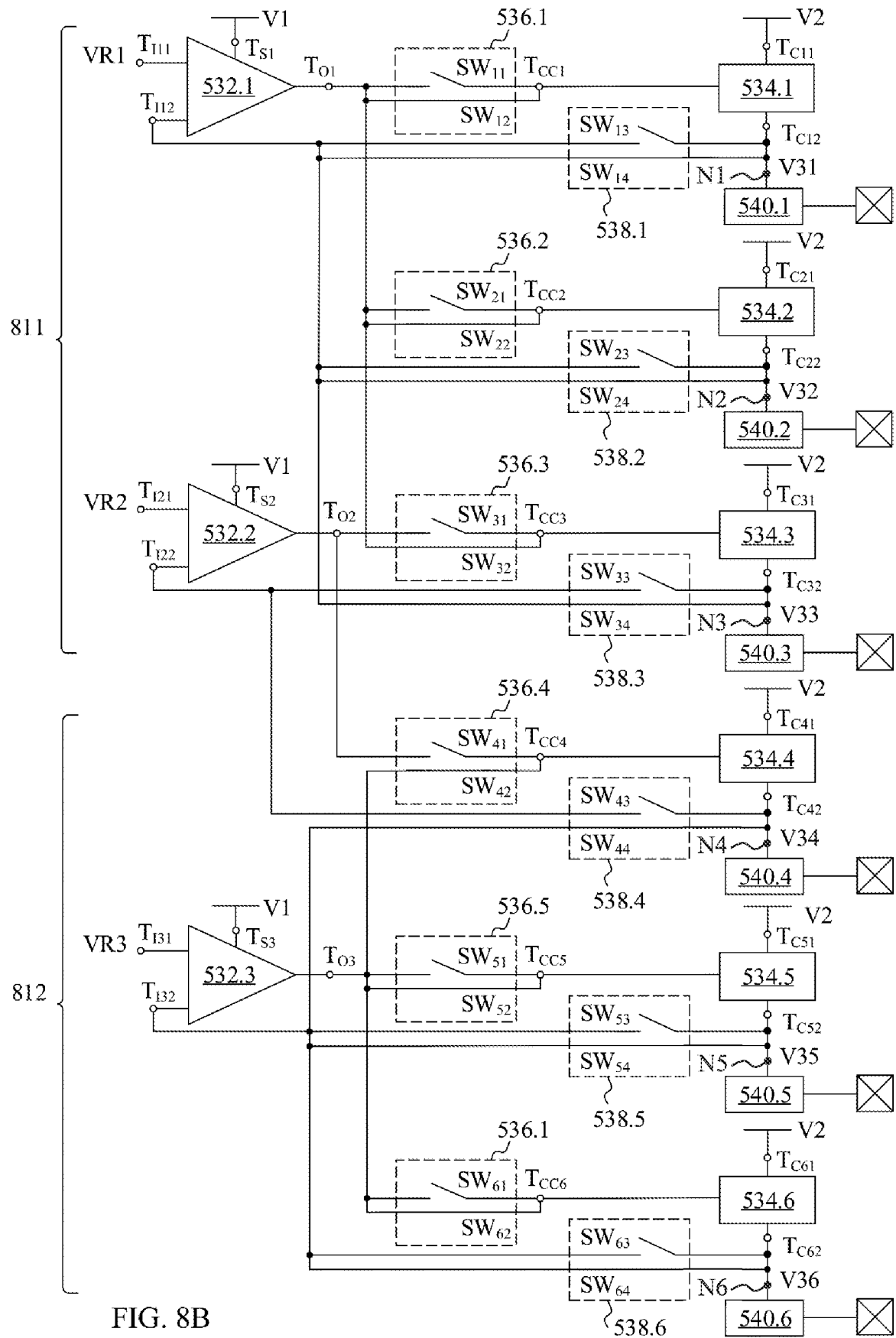

FIG. 8B is a diagram illustrating exemplary operation in a second mode of the voltage regulator circuit 730 shown in FIG. 7 in accordance with some embodiments of the present disclosure. In the present embodiment, the voltage regulator circuit 730 operating in the second mode can support MIPI C-PHY signaling. In operation, each of the switches $SW_{11}$, $SW_{13}$, $SW_{21}$, $SW_{23}$, $SW_{31}$, $SW_{33}$, $SW_{41}$, $SW_{43}$, $SW_{51}$, $SW_{53}$, $SW_{61}$ and $SW_{63}$ is switched off. Each of the switches $SW_{12}$, $SW_{14}$, $SW_{22}$, $SW_{24}$, $SW_{32}$, $SW_{34}$, $SW_{42}$, $SW_{44}$, $SW_{52}$, $SW_{54}$, $SW_{62}$ and $SW_{64}$ is switched on. As a result, the amplifier 532.1, shared by the transistors 534.1-534.3, can operate together with each of the transistors 534.1-534.3 to implement a voltage regulator. The amplifier 532.3, shared by the transistors 534.4-534.6, can operate together with each of the transistors 534.4-534.6 to implement a voltage regulator. The circuit configuration shown in FIG. 8B can implement two C-PHY trios 811 and 812. The voltage regulator circuit 730 can utilize a simplified design, where a single amplifier is utilized to provide a constant current for each C-PHY trio, to support MIPI C-PHY signaling.

The voltage regulation circuit architecture described above is provided for illustrative purposes, and is not intended to limit the scope of the present disclosure. In some embodiments, at least one of the switch circuits 536.1, 536.2, 536.4, 538.1, 538.2 and 538.4 shown in FIG. 5 are optional. In some embodiments, at least one of the switch circuits 536.3 and 538.3 shown in FIG. 5 can be implemented using a single pole double throw (SPDT) switch. In some embodiments, at least one of the switch circuits 536.1, 536.2, 536.5, 536.6, 538.1, 538.2, 538.5 and 538.6 shown in FIG. 7 are optional. In some embodiments, at least one of the switch circuits 536.3, 536.4, 538.3 and 538.4 shown in FIG. 7 can be implemented using an SPDT switch. As long as a voltage regulator circuit can utilize a configurable design where a single amplifier can be configured to operate together with different transistors in different modes of operation to implement one or more voltage regulators, or utilize a configurable design where a single transistor can be configurable to operate together with different amplifiers in different modes of operation to implement a voltage regulator, associated modifications and alternatives fall within the scope of the present disclosure.

With the use of the proposed configurable voltage regulation scheme, an amplifier can operate together with one or more transistors to implement one or more configurable voltage regulators capable of supporting different lane configurations. Additionally, or alternatively, with the use of the proposed configurable voltage regulation scheme, a transistor can operate together with different amplifiers to implement a configurable voltage regulator capable of supporting different lane configurations. The proposed configurable voltage regulation scheme provides a flexible and simplified design compliant with different interface specifications.

Figure 9:
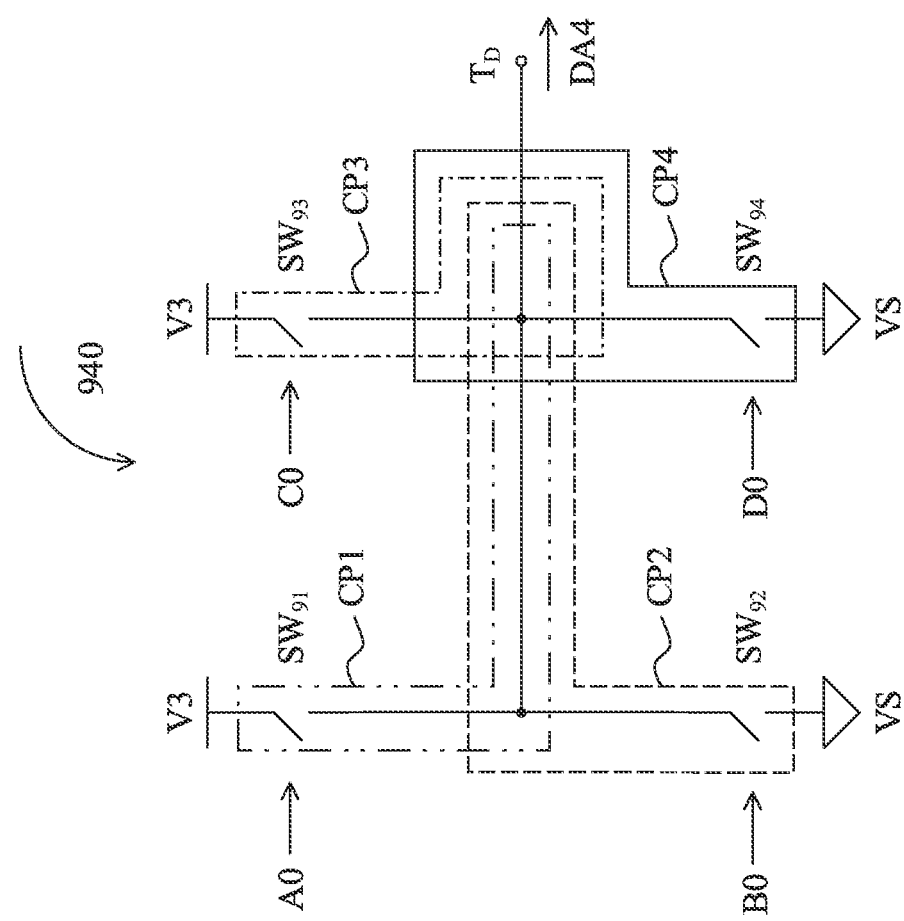
FIG. 9 illustrates an implementation of at least a portion of the driver circuit shown in FIG. 1 in accordance with some embodiments of the present disclosure.

FIG. 9 illustrates an implementation of at least a portion of the driver circuit 140 shown in FIG. 1 in accordance with some embodiments of the present disclosure. The driver circuit 940 can also be used to implement each driver circuit shown in FIG. 5 and FIG. 7. The driver circuit 940 may include, but is not limited to, a data output terminal $T_D$ and a plurality of switches $SW_{91}$-$SW_{94}$. The data output terminal $T_D$ is arranged to output the output data DA4, which is generated according to the decoded data DA3 and the supply voltage V3. The switch $SW_{91}$ is selectively coupled between the supply voltage V3 and the data output terminal $T_D$ according to the decoded data DA3. The switch $SW_{92}$ is selectively coupled between the data output terminal $T_D$ and a reference voltage VS according to the decoded data DA3. The reference voltage VS may be at a voltage level less than that of the supply voltage V3, such as a ground voltage level.

When one of the switch $SW_{91}$ and the switch $SW_{92}$ is switched on, the other of the switch $SW_{91}$ and the switch $SW_{92}$ is switched off. In addition, the switch $SW_{93}$ is selectively coupled between the supply voltage V3 and the data output terminal $T_D$ according to the decoded data DA3. The switch $SW_{94}$ is selectively coupled between the data output terminal $T_D$ and the reference voltage VS according to the decoded data DA3. When one of the switch $SW_{93}$ and the switch $SW_{94}$ is switched on, the other of the switch $SW_{93}$ and the switch $SW_{94}$ is switched off.

In the present embodiment, the switches $SW_{91}$-$SW_{94}$ may be controlled by four bits A0-D0 included in the decoded data DA3. The supply voltage V3 can be coupled to the data output terminal $T_D$ through a circuit path CP1, where the switch $SW_{91}$ is included, according to the bit A0. The reference voltage VS can be coupled to the data output terminal $T_D$ through a circuit path CP2, where the switch $SW_{92}$ is included, according to the bit B0. The supply voltage V3 can be coupled to the data output terminal $T_D$ through a circuit path CP3, where the switch $SW_{93}$ is included, according to the bit C0. The reference voltage VS can be coupled to the data output terminal $T_D$ through a circuit path CP4, where the switch $SW_{94}$ is included, according to the bit D0. When one of the switches $SW_{91}$-$SW_{94}$ is turned on, a voltage drop can be established across a corresponding circuit path. For example, each of the circuit paths CP1-CP4 may include at least one resistive element which is connected to a corresponding switch in series.

Figure 10A:
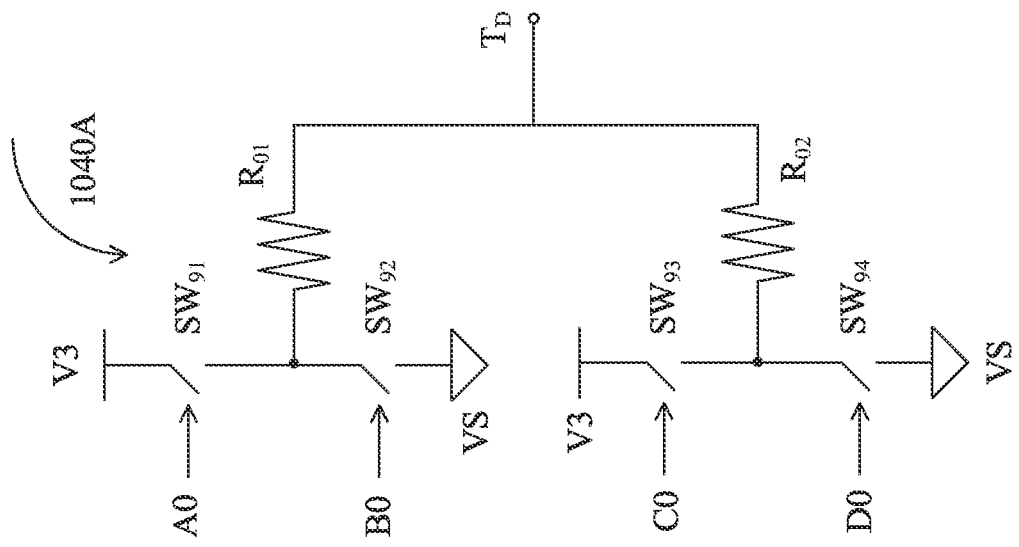
FIG. 10A to FIG. 10C illustrate implementations of the driver circuit shown in FIG. 9 in accordance with some embodiments of the present disclosure.
Figures 10B, 10C:
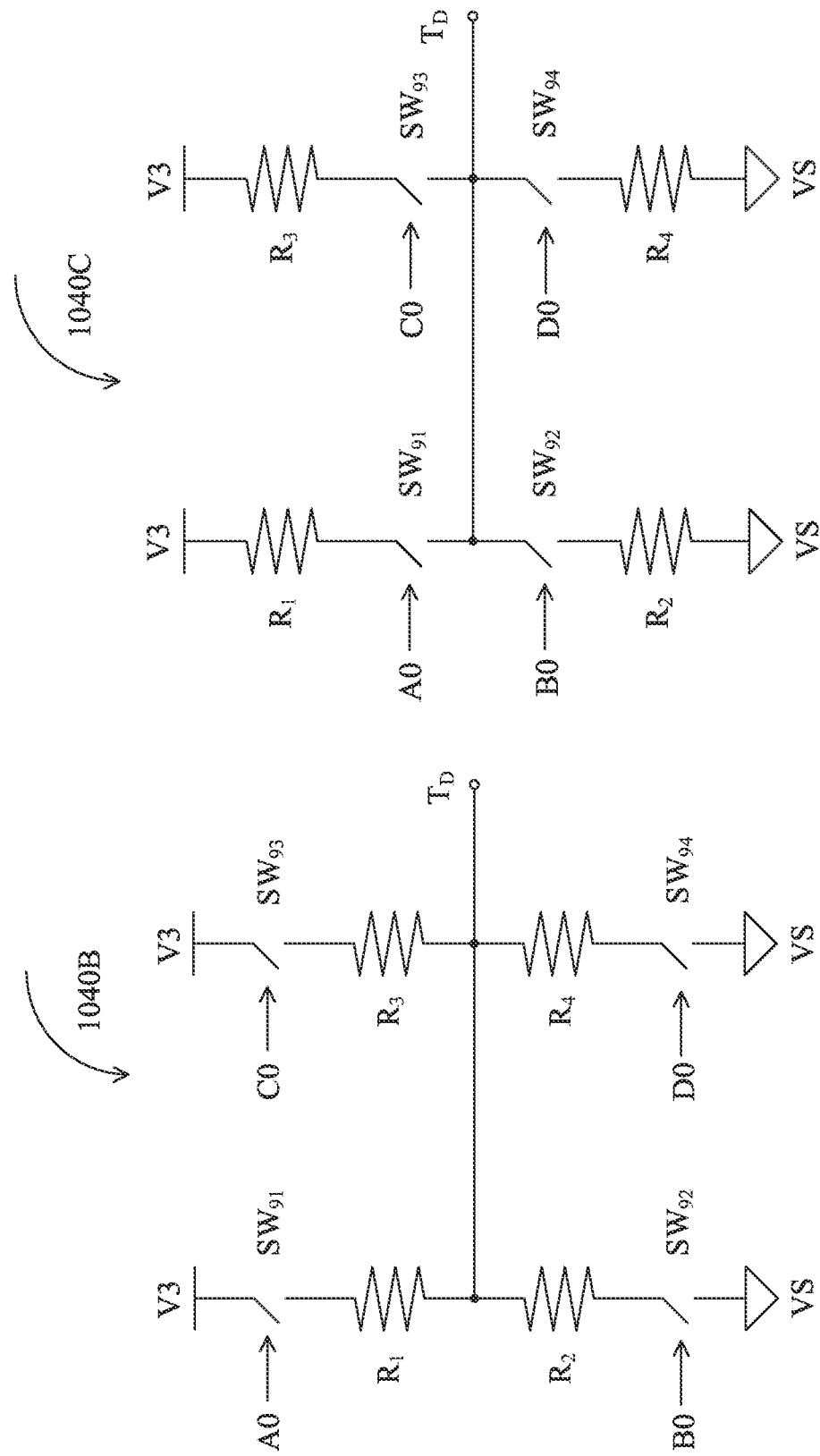

FIG. 10A to FIG. 10C illustrate implementations of the driver circuit 940 shown in FIG. 9, respectively, in accordance with some embodiments of the present disclosure. Referring firstly to FIG. 10A, the driver circuit 1040A includes a plurality of resistive elements $R_{O1}$ and $R_{O2}$, each of which is coupled to the data output terminal $T_D$. The circuit path CP1 shown in FIG. 9 can be implemented using the switch $SW_{91}$ and the resistive element $R_{O1}$, and the circuit path CP2 shown in FIG. 9 can be implemented using the switch $SW_{92}$ and the resistive element $R_{O1}$. Also, the circuit path CP3 shown in FIG. 9 can be implemented using the switch $SW_{93}$ and the resistive element $R_{O2}$, and the circuit path CP4 shown in FIG. 9 can be implemented using the switch $SW_{94}$ and the resistive element $R_{O2}$.

Referring to FIG. 10B, the driver circuit 1040B includes a plurality of resistive elements $R_1$-$R_4$, each of which is coupled to the data output terminal $T_D$. The circuit path CP1 shown in FIG. 9 can be implemented using the switch $SW_{91}$ and the resistive element $R_1$, and the circuit path CP2 shown in FIG. 9 can be implemented using the switch $SW_{92}$ and the resistive element $R_2$. The circuit path CP3 shown in FIG. 9 can be implemented using the switch $SW_{93}$ and the resistive element $R_3$, and the circuit path CP4 shown in FIG. 9 can be implemented using the switch $SW_{94}$ and the resistive element $R_4$. In the present embodiment, a ratio of a resistance of the resistive element $R_1$ to a resistance of the resistive element $R_3$ is equal to, or substantially equal to, a ratio of a resistance of the resistive element $R_2$ to a resistance of the resistive element $R_4$.

Referring to FIG. 10C, the structure of the driver circuit 1040C is identical/similar to that of the driver circuit 1040B shown in FIG. 10B except that the arrangement of the resistive elements $R_1$-$R_4$. In the present embodiment, the resistive element $R_1$ is disposed between the supply voltage V3 and the switch $SW_{91}$, and the resistive element $R_2$ is disposed between the switch $SW_{92}$ and the reference voltage VS. Also, the resistive element $R_3$ is disposed between the supply voltage V3 and the switch $SW_{93}$, and the resistive element $R_4$ is disposed between the switch $SW_{94}$ and the reference voltage VS.

Figure 11A:
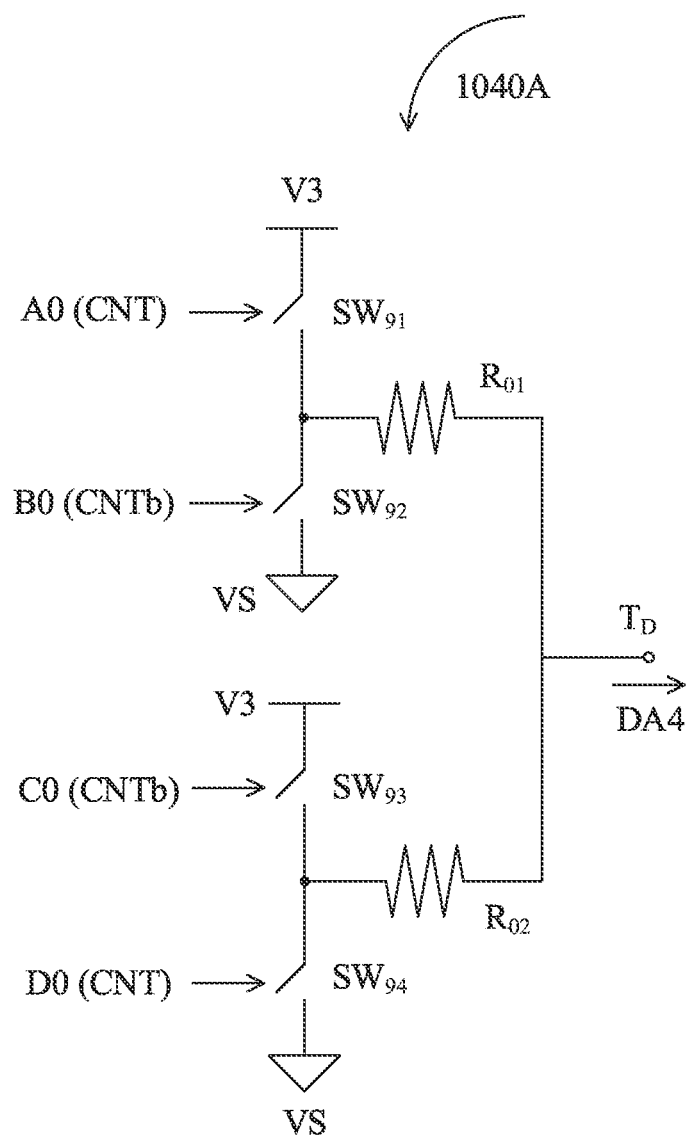
FIG. 11A to FIG. 11C illustrate modes of operation of the driver circuits shown in FIG. 10A to FIG. 10C, respectively, in accordance with some embodiments of the present disclosure.
Figures 11B, 11C:
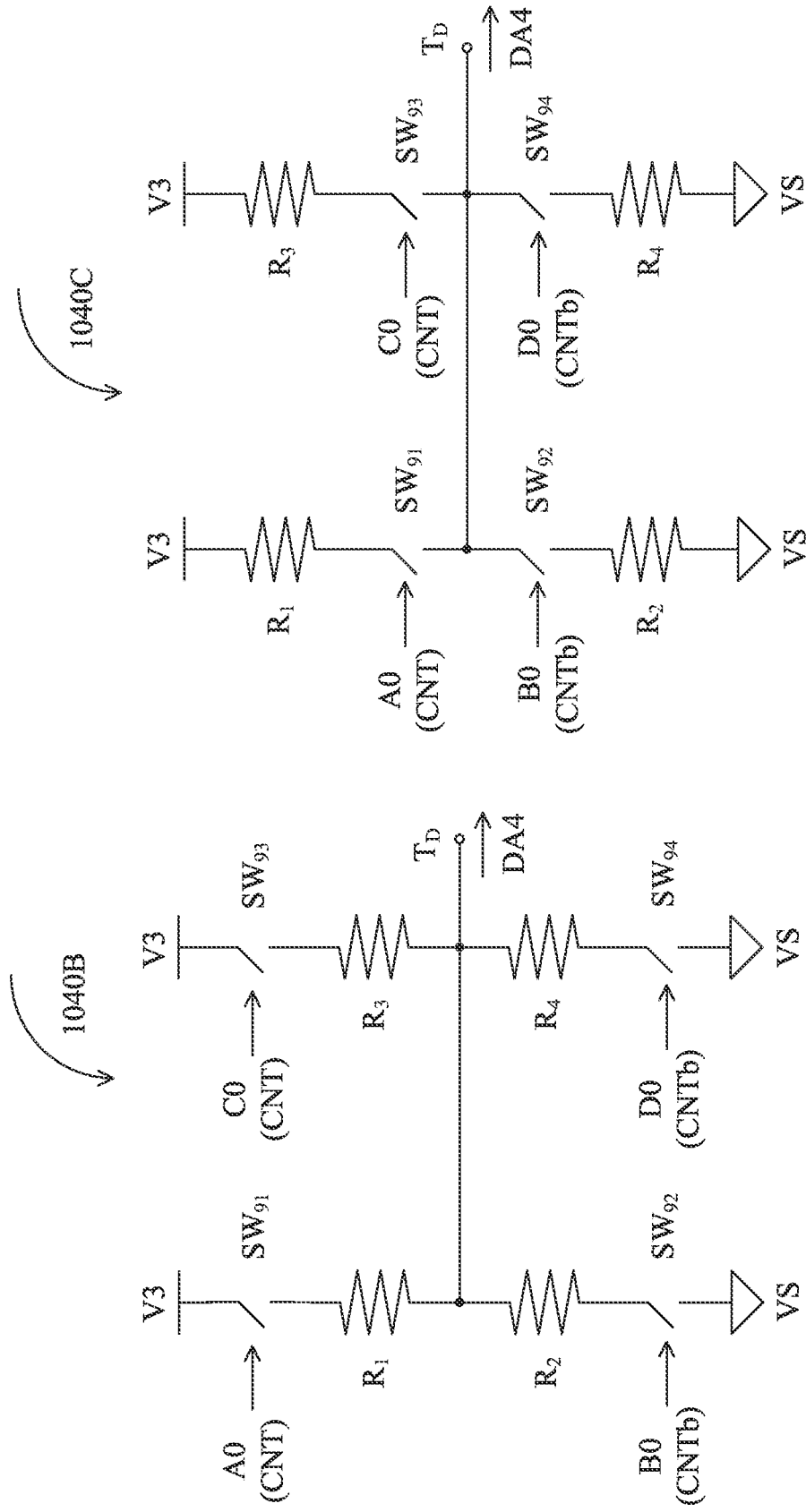

Each of the driver circuits 1040A-1040C shown in FIG. 10A to FIG. 10C can be configured as different types of drivers, such as a differential driver and a three-level driver, according to a bit pattern of the bits A0-D0. FIG. 11A to FIG. 11C illustrate modes of operation of the driver circuits 1040A-1040C shown in FIG. 10A to FIG. 10C, respectively, in accordance with some embodiments of the present disclosure. Referring firstly to FIG. 11A, each of the bits A0 and D0 can have a same bit value, and each of the bits B0 and C0 can have a same bit value equal to an inverse of the bit value of the bit A0/D0. The switches $SW_{91}$ and $SW_{94}$ can be regarded as being controlled by a same control bit CNT, and the switches $SW_{92}$ and $SW_{93}$ can be regarded as being controlled by a same control bit CNTb, which is an inverted version of the control bit CNT.

In operation, when the switch $SW_{91}$ is switched on, the switch $SW_{94}$ is switched on, and each of the switches $SW_{92}$ and $SW_{93}$ is switched off. The output data DA4 generated at the data output terminal $T_D$ may be a data signal at a first voltage level. An output impedance of the driver circuit 1040A looking into the data output terminal $T_D$ is equal to an equivalent impedance of the resistive elements $R_{O1}$ and $R_{O2}$ connected in parallel. When the switch $SW_{91}$ is switched off, the switch $SW_{94}$ is switched off, and each of the switches $SW_{92}$ and $SW_{93}$ is switched on. The output data DA4 generated at the data output terminal $T_D$ may be a data signal at a second voltage level. The output impedance of the driver circuit 1040A looking into the data output terminal $T_D$ is still equal to the equivalent impedance of the resistive elements $R_{O1}$ and $R_{O2}$ connected in parallel. In some cases where the resistive elements $R_{O1}$ and $R_{O2}$ have different resistances, one of the first voltage level and the second voltage level can correspond to a logic high level, and the other of the first voltage level and the second voltage level can correspond to a logic low level. As a result, the driver circuit 1040A can be configured as a differential driver.

Referring to FIG. 11B, each of the bits A0 and C0 can have a same bit value, and each of the bits B0 and D0 can have a same bit value equal to an inverse of the bit value of the bit A0/C0. The switches $SW_{91}$ and $SW_{93}$ can be regarded as being controlled by the same control bit CNT, and the switches $SW_{92}$ and $SW_{94}$ can be regarded as being controlled by the same control bit CNTb, i.e. an inverted version of the control bit CNT. In operation, when the switch $SW_{91}$ is switched on, the switch $SW_{93}$ is switched on, and each of the switches $SW_{92}$ and $SW_{94}$ is switched off. The output data DA4 generated at the data output terminal $T_D$ may be a data signal at a first voltage level, which corresponds to one of a logic high level and a logic low level. When the switch $SW_{91}$ is switched off, the switch $SW_{93}$ is switched off, and each of the switches $SW_{92}$ and $SW_{94}$ is switched on. The output data DA4 generated at the data output terminal $T_D$ may be a data signal at a second voltage level, which corresponds to the other of the logic high level and the logic low level. As a result, the driver circuit 1040B can be configured as a differential driver.

It is worth noting that, when the driver circuit 1040B is configured to output the output data DA4, an output impedance of the driver circuit 1040B looking into the data output terminal $T_D$ is equal to either an equivalent impedance of the resistive elements $R_1$ and $R_3$ connected in parallel or an equivalent impedance of the resistive elements $R_2$ and $R_4$ connected in parallel. Consider some cases where a ratio of a resistance of the resistive element $R_1$ to a resistance of the resistive element $R_3$ is equal to a ratio of a resistance of the resistive element $R_2$ to a resistance of the resistive element $R_4$. When the resistive elements $R_1$ and $R_2$, or the resistive elements $R_3$ and $R_4$, have the same resistance, the driver circuit 1040B may have the same output impedance whether the output data DA4 is logically high or logically low.

Referring to FIG. 11C, the control scheme used for the driver circuit 1040C is identical to the control scheme used for the driver circuit 1040B shown in FIG. 11B. As those skilled in the art can appreciate operation of the driver circuit 1040C after reading the above paragraphs directed to FIG. 11B, further description is omitted here for brevity.

Figure 12A:
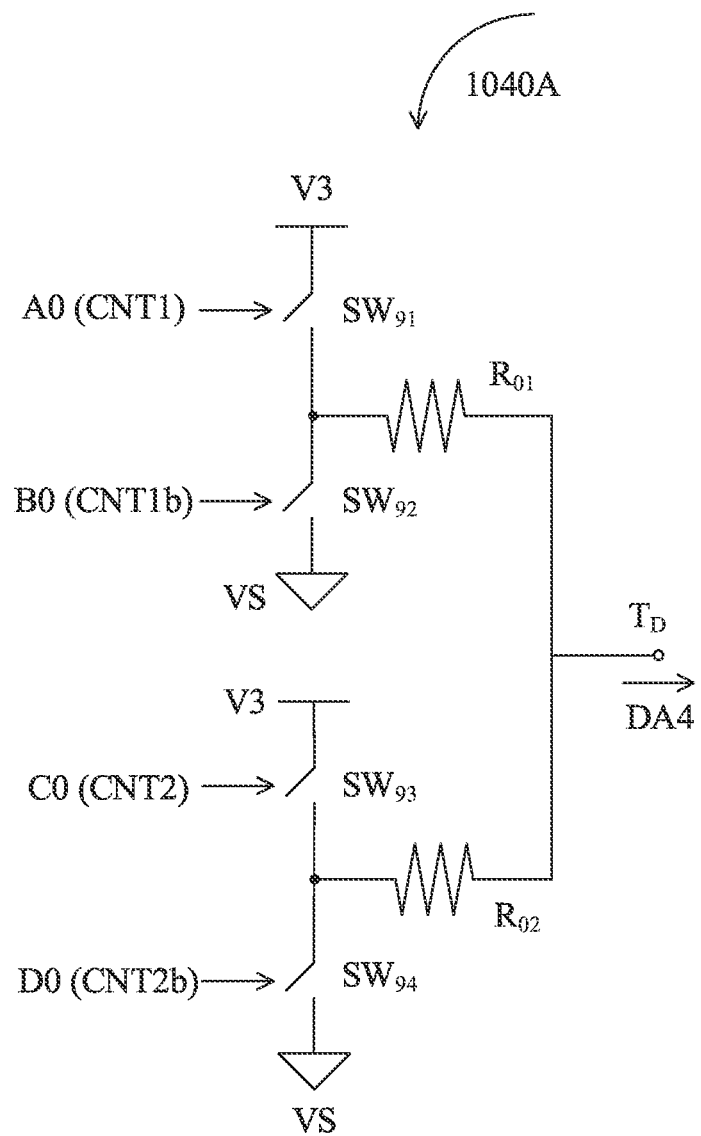
FIG. 12A to FIG. 12C illustrate modes of operation of the driver circuits shown in FIG. 10A to FIG. 10C, respectively, in accordance with some embodiments of the present disclosure.
Figures 12B, 12C:
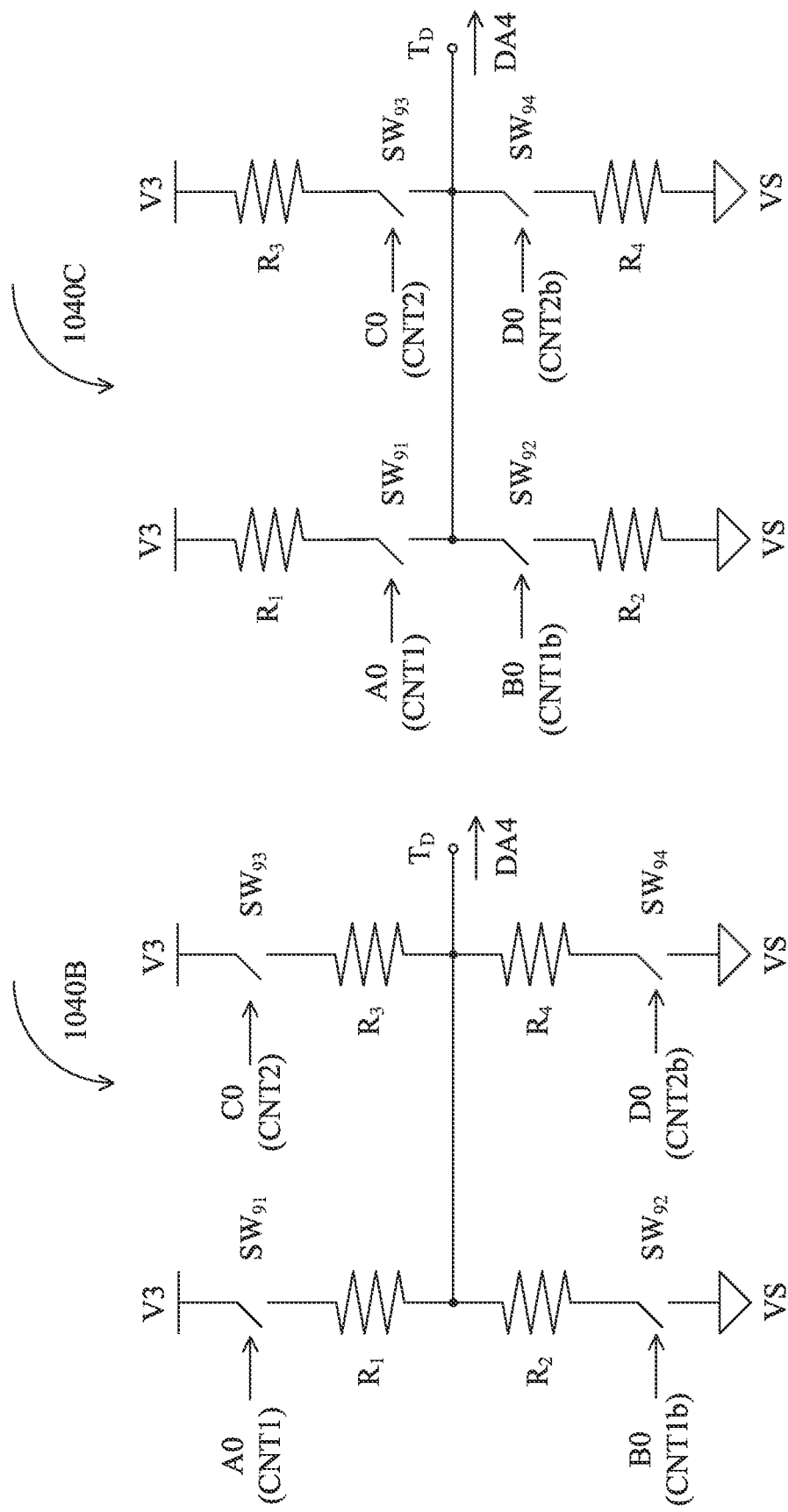

In some embodiments, each of the driver circuits 1040A-1040C shown in FIG. 10A to FIG. 10C can be configured as a three-level driver. FIG. 12A to FIG. 12C illustrate modes of operation of the driver circuits 1040A-1040C shown in FIG. 10A to FIG. 10C, respectively, in accordance with some embodiments of the present disclosure. Referring firstly to FIG. 12A, the bit B0 can have a bit value equal to an inverse of a bit value of the bit A0, and the bit D0 can have a bit value equal to an inverse of a bit value of the bit C0. The switches $SW_{91}$ and $SW_{92}$ can be regarded as being controlled by control bits CNT1 and CNT1b, respectively, wherein the control bit CNT1b is an inverted version of the control bit CNT1. Similarly, the switches $SW_{93}$ and $SW_{94}$ can be regarded as being controlled by control bits CNT2 and CNT2b, respectively, wherein the control bit CNT2b is an inverted version of the control bit CNT2.

In operation, when each of the switches $SW_{91}$ and $SW_{93}$ is switched off, e.g. a bit pattern of the control bits CNT1 and CNT2 is "00", each of the switches $SW_{92}$ and $SW_{94}$ is switched on. The output data DA4 generated at the data output terminal $T_D$ may be a data signal at a first voltage level equal to a voltage level of the reference voltage VS. When each of the switches $SW_{91}$ and $SW_{93}$ is switched on, e.g. a bit pattern of the control bits CNT1 and CNT2 is "11", each of the switches $SW_{92}$ and $SW_{94}$ is switched off. The output data DA4 generated at the data output terminal $T_D$ may be a data signal at a second voltage level equal to a voltage level of the supply voltage V3. When the switch $SW_{91}$ is switched off and the switch $SW_{93}$ is switched on, e.g. a bit pattern of the control bits CNT1 and CNT2 is "01", the switch $SW_{92}$ is switched on and the switch $SW_{94}$ is switched off. The output data DA4 generated at the data output terminal $T_D$ may be a data signal at a third voltage level between the voltage level of the reference voltage VS and the voltage level of the supply voltage V3. When the switch $SW_{91}$ is switched on and the switch $SW_{93}$ is switched off, e.g. a bit pattern of the control bits CNT1 and CNT2 is "10", the switch $SW_{92}$ is switched off and the switch $SW_{94}$ is switched on. The output data DA4 generated at the data output terminal $T_D$ may be a data signal at a fourth voltage level between the voltage level of the reference voltage VS and the voltage level of the supply voltage V3.

In the present embodiment, the resistive element $R_{O1}$ and $R_{O2}$ can have a same resistance. As a result, each of the third voltage level and the fourth voltage level is equal to an average of the voltage level of the reference voltage VS and the voltage level of the supply voltage V3. The driver circuit 1040A can be configured as a three-level driver. It is worth noting that the driver circuit 1040A can be configured as a four-level driver in some embodiments where the resistive element $R_{O1}$ and $R_{O2}$ have different resistances.

Referring to FIG. 12B, the control scheme used for the driver circuit 1040B is identical to the control scheme used for the driver circuit 1040A shown in FIG. 12A. For example, the switches $SW_{91}$ and $SW_{92}$ can be regarded as being controlled by the control bits CNT1 and CNT1b, respectively. The switches $SW_{93}$ and $SW_{94}$ can be regarded as being controlled by the control bits CNT2 and CNT2b, respectively.

Similarly, when each of the switches $SW_{91}$ and $SW_{93}$ is switched off, each of the switches $SW_{92}$ and $SW_{94}$ is switched on. The output data DA4 generated at the data output terminal $T_D$ may be a data signal at a first voltage level equal to a voltage level of the reference voltage VS. When each of the switches $SW_{91}$ and $SW_{93}$ is switched on, each of the switches $SW_{92}$ and $SW_{94}$ is switched off. The output data DA4 generated at the data output terminal $T_D$ may be a data signal at a second voltage level equal to a voltage level of the supply voltage V3. When the switch $SW_{91}$ is switched off and the switch $SW_{93}$ is switched on, the switch $SW_{92}$ is switched on and the switch $SW_{94}$ is switched off. The output data DA4 generated at the data output terminal $T_D$ may be a data signal at a third voltage level between the voltage level of the reference voltage VS and the voltage level of the supply voltage V3. When the switch $SW_{91}$ is switched on and the switch $SW_{93}$ is switched off, the switch $SW_{92}$ is switched off and the switch $SW_{94}$ is switched on. The output data DA4 generated at the data output terminal $T_D$ may be a data signal at a fourth voltage level between the voltage level of the reference voltage VS and the voltage level of the supply voltage V3.

In the present embodiment, the resistive elements $R_1$-$R_4$ can have a same resistance. As a result, each of the third voltage level and the fourth voltage level is equal to an average of the voltage level of the reference voltage VS and the voltage level of the supply voltage V3. The driver circuit 1040B can be configured as a three-level driver. It is worth noting that the driver circuit 1040A can be configured as a four-level driver in some embodiments where at least two of the resistive elements $R_1$-$R_4$ have different resistances.

Referring to FIG. 12C, the control scheme used for the driver circuit 1040C is identical to the control scheme used for the driver circuit 1040B shown in FIG. 12B. As those skilled in the art can appreciate operation of the driver circuit 1040C after reading the above paragraphs directed to FIG. 12A and FIG. 12B, further description is omitted here for brevity.

The structures of the driver circuits described above with reference to FIG. 9 to FIG. 12C can be used to implement other types of multi-level drivers which can serve as de-emphasis/pre-emphasis drivers. FIG. 13 illustrates an implementation of at least a portion of the driver circuit 140 shown in FIG. 1 in accordance with some embodiments of the present disclosure. The driver circuit 1340 can also be used to implement each driver circuit shown in FIG. 5 and FIG. 7. The driver circuit 1340 may include, but is not limited to, a pair of differential data output terminals and a plurality of variable impedance circuits 1350 and 1360. The pair of differential data output terminals, arranged to output the output data DA4, includes a plurality of data output terminals $T_{DP}$ and $T_{DN}$. A termination element $R_{TERM}$, or a termination resistor, is placed between the data output terminals $T_{DP}$ and $T_{DN}$.

The variable impedance circuit 1350 is switchably coupled between the supply voltage V3 and the data output terminal $T_{DP}$ according to the decoded data DA3. For example, the driver circuit 1340 further includes a switch $SW_P$, which is configured to selectively couple the supply voltage V3 to the variable impedance circuit 1350 according to the decoded data DA3. Those skilled in the art will recognize that the switch $SW_P$ can be disposed between the variable impedance circuit 1350 and the data output terminal $T_{DP}$ without departing from the scope of the present disclosure. In addition, when the variable impedance circuit 1350 is coupled between the supply voltage V3 and the data output terminal $T_{DP}$, an impedance $R_P$ of the variable impedance circuit 1350 is determined according to the decoded data DA3.

Similarly, the variable impedance circuit 1360 can be switchably coupled between the data output terminal $T_{DN}$ and the reference voltage VS according to the decoded data DA3. For example, the driver circuit 1360 further includes a switch $SW_N$, which is configured to selectively couple the reference voltage VS to the variable impedance circuit 1360 according to the decoded data DA3. Those skilled in the art will recognize that the switch $SW_N$ can be disposed between the variable impedance circuit 1360 and the data output terminal $T_{DN}$ without departing from the scope of the present disclosure. In addition, when the variable impedance circuit 1360 is coupled between the data output terminal $T_{DN}$ and the reference voltage VS, an impedance $R_N$ of the variable impedance circuit 1360 is determined according to the decoded data DA3.

In the present embodiment, each of the impedances $R_P$ and $R_N$ can be dynamically switched between two different values $R_{V1}$ and $R_{V2}$, such that the driver circuit 1340 can be implemented as a de-emphasis/pre-emphasis driver capable of generating four voltage levels. In operation, when the driver circuit 1340 acts as a de-emphasis/pre-emphasis driver, the switches $SW_P$ and $SW_N$ are switched on according to the decoded data DA3. Also, each of the impedance $R_P$ of the variable impedance circuit 1350 and the impedance $R_N$ of the variable impedance circuit 1360 varies according to the decoded data DA3. As a result, the voltage drop $V_{TERM}$ across the termination element $R_{TERM}$ varies according to respective values of the impedances $R_P$ and $R_N$. For example, when each of the resistances $R_P$ and $R_N$ is switched to the value $R_{V1}$, the voltage drop $V_{TERM}$ is equal to a first voltage. When the resistances $R_P$ and $R_N$ are switched to the values $R_{V1}$ and $R_{V2}$, respectively, the voltage drop $V_{TERM}$ is equal to a second voltage different from the first voltage. When the resistances $R_P$ and $R_N$ are switched to the values $R_{V2}$ and $R_{V1}$, respectively, the voltage drop $V_{TERM}$ is equal to a third voltage different from each of the first voltage and the second voltage. When each of the resistances $R_P$ and $R_N$ is switched to the value $R_{V2}$, the voltage drop $V_{TERM}$ is equal to a fourth voltage different from each of the first, second and third voltages.

Compared with a de-emphasis/pre-emphasis driver, which adjusts an output voltage level by utilizing shunt resistors arranged between a supply/ground voltage and a data output terminal, the proposed driver scheme can effectively reduce power consumption since a current supplied by a power source will not increase when de-emphasis/pre-emphasis is enabled.

In some embodiments, at least one of the variable impedance circuits 1350 and 1360 can be implemented using the driver circuits 1040A-1040C shown in FIGS. 10A-10C. Firstly, referring to FIG. 13 and also to FIG. 10A, the variable impedance circuit 1350 can be implemented using the driver circuit 1040A. The switch $SW_P$ can be configured to selectively couple the supply voltage V3 to the switches $SW_{91}$ and $SW_{93}$, and the data output terminal $T_{DP}$ can serve as an embodiment of the data output terminal $T_D$. The impedance $R_P$ of the variable impedance circuit 1350 is equal to an output impedance of the driver circuit 1040A.

In operation, when the switches $SW_{91}$ and $SW_{93}$ are switched on and the switches $SW_{92}$ and $SW_{94}$ are switched off, the impedance $R_P$ is equal to a resistance of the resistive elements $R_{01}$ and $R_{02}$ connected in parallel. When the switch $SW_{91}$ is switched on and each of the switches $SW_{92}$-$SW_{94}$ is switched off, the impedance $R_P$ is equal to the resistance of the resistive element $R_{01}$, which is different from the resistance of the resistive elements $R_{01}$ and $R_{02}$ connected in parallel. When the switch $SW_{93}$ is switched on, and each of the switches $SW_{91}$, $SW_{92}$ and $SW_{94}$ is switched off, the impedance $R_P$ is equal to the resistance of the resistive element $R_{02}$, which is different from the resistance of the resistive elements $R_{01}$ and $R_{02}$ connected in parallel. As a result, the variable impedance circuit 1350 implemented using the driver circuit 1040A can provide at least two different impedances.

Similarly, in some embodiments where the variable impedance circuit 1360 is implemented using the driver circuit 1040A, the variable impedance circuit 1360 can provide at least two different impedances. For example, the switch $SW_N$ is configured to selectively couple the reference voltage VS to the switches $SW_{92}$ and $SW_{94}$, and the data output terminal $T_{DN}$ can serve as an embodiment of the data output terminal $T_D$. The impedance $R_N$ of the variable impedance circuit 1360 is equal to the output impedance of the driver circuit 1040A. In operation, when the switches $SW_{92}$ and $SW_{94}$ are switched on and the switches $SW_{91}$ and $SW_{93}$ are switched off, the impedance $R_N$ is equal to the resistance of the resistive elements $R_{01}$ and $R_{02}$ connected in parallel. When the switch $SW_{92}$ is switched on and each of the switches $SW_{91}$, $SW_{93}$ and $SW_{94}$ is switched off, the impedance $R_N$ is equal to the resistance of the resistive element $R_{01}$. When the switch $SW_{94}$ is switched on and each of the switches $SW_{91}$-$SW_{93}$ is switched off, the impedance $R_N$ is equal to the resistance of the resistive element $R_{02}$.

Referring to FIG. 13 and also to FIG. 10B, the variable impedance circuit 1350 can be implemented using the driver circuit 1040B. The switch $SW_P$ can be configured to selectively couple the supply voltage V3 to the switches $SW_{91}$ and $SW_{93}$, and the data output terminal $T_{DP}$ can serve as an embodiment of the data output terminal $T_D$. The impedance $R_P$ of the variable impedance circuit 1350 is equal to the output impedance of the driver circuit 1040B.

In operation, when the switches $SW_{91}$ and $SW_{93}$ are switched on and the switches $SW_{92}$ and $SW_{94}$ are switched off, the impedance $R_P$ is equal to a resistance of the resistive elements $R_1$ and $R_3$ connected in parallel. When the switch $SW_{91}$ is switched on and each of the switches $SW_{92}$-$SW_{94}$ is switched off, the impedance $R_P$ is equal to the resistance of the resistive element $R_1$, which is different from the resistance of the resistive elements $R_1$ and $R_3$ connected in parallel. When the switch $SW_{93}$ is switched on, and each of the switches $SW_{91}$, $SW_{92}$ and $SW_{94}$ is switched off, the impedance $R_P$ is equal to the resistance of the resistive element $R_3$, which is different from the resistance of the resistive elements $R_1$ and $R_3$ connected in parallel. As a result, the variable impedance circuit 1350 implemented using the driver circuit 1040B can provide at least two different impedances.

Similarly, in some embodiments where the variable impedance circuit 1360 is implemented using the driver circuit 1040B, the variable impedance circuit 1360 can provide at least two different impedances. For example, the switch $SW_N$ is configured to selectively couple the reference voltage VS to the switches $SW_{92}$ and $SW_{94}$, and the data output terminal $T_{DN}$ can serve as an embodiment of the data output terminal $T_D$. The impedance $R_N$ of the variable impedance circuit 1360 is equal to the output impedance of the driver circuit 1040B. In operation, when the switches $SW_{92}$ and $SW_{94}$ are switched on and the switches $SW_{91}$ and $SW_{93}$ are switched off, the impedance $R_N$ is equal to the resistance of the resistive elements $R_2$ and $R_4$ connected in parallel. When the switch $SW_{92}$ is switched on and each of the switches $SW_{91}$, $SW_{93}$ and $SW_{94}$ is switched off, the impedance $R_N$ is equal to the resistance of the resistive element $R_2$. When the switch $SW_{94}$ is switched on and each of the switches $SW_{91}$-$SW_{93}$ is switched off, the impedance $R_N$ is equal to the resistance of the resistive element $R_4$.

Referring to FIG. 13 and also to FIG. 10C, the variable impedance circuit 1350 can be implemented using the driver circuit 1040C. Additionally, or alternatively, the variable impedance circuit 1360 can be implemented using the driver circuit 1040C. As those skilled in the art can appreciate that the variable impedance circuit 1350/1360 implemented using the driver circuit 1040C can provide at least two different impedances after reading the above paragraphs directed to FIG. 10B and FIG. 10C, similar description is omitted here for brevity.

FIG. 14 illustrates another implementation of at least a portion of the driver circuit 140 shown in FIG. 1 in accordance with some embodiments of the present disclosure. The circuit structure of the driver circuit 1440 is similar/identical to that of the driver circuit 1340 shown in FIG. 13 except that each of the impedance circuits 1450 and 1460 are configured to provide a fixed impedance value. In the present embodiment, the impedance circuit 1450 may be implemented using an impedance $R_{PF}$, and the impedance circuit 1460 may be implemented using an impedance $R_{NF}$. Each of the impedances $R_{PF}$ and $R_{NF}$ has a fixed impedance value which may be equal to a smaller one of the values $R_{V1}$ and $R_{V2}$ shown in FIG. 13. As a result, in some cases where at least one of the variable impedance circuits 1350 and 1360 shown in FIG. 13 is configured to provide an impedance value equal to a larger one of the values $R_{V1}$ and $R_{V2}$, the output data DA4 sent from the driver circuit 1440 can have a large output swing when compared to that of the output data DA4 sent from the driver circuit 1340 shown in FIG. 13. As those skilled in the art can appreciate the operation of the driver circuit 1440 after reading the above paragraphs directed to FIG. 1 and FIG. 4 to FIG. 13, further description is omitted here for brevity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A driver circuit, comprising:
    a data output terminal, arranged for outputting output data;
    a first switch, selectively coupled between a first voltage and the data output terminal;
    a second switch, selectively coupled between the data output terminal and a second voltage;
    a third switch, selectively coupled between the first voltage and the data output terminal; and
    a fourth switch, selectively coupled between the data output terminal and the second voltage;
    wherein when one of the first switch and the second switch is switched on, the other of the first switch and the second switch is switched off; when one of the third switch and the fourth switch is switched on, the other of the third switch and the fourth switch is switched off;
    wherein when each of the first switch and the third switch is switched on, the output data is at a first voltage level; when each of the second switch and the fourth switch is switched on, the output data is at a second voltage level; when one of the first switch and the third switch is switched on, and the other of the first switch and the third switch is switched off, the output data is at a third voltage level; the first voltage level, the second voltage level and the third voltage level are different from each other.

2. The driver circuit of claim 1, wherein the driver circuit further comprises:
    a first resistive element, coupled between a first node and the data output terminal, wherein the first switch is arranged to selectively couple the first voltage to the first node, and the second switch is arranged to selectively couple the first node to the second voltage; and
    a second resistive element, coupled between a second node and the data output terminal, wherein the third switch is arranged to selectively couple the first voltage to the second node, and the fourth switch is arranged to selectively couple the second node to the second voltage.

3. The driver circuit of claim 2, wherein a resistance of the first resistive element is equal to a resistance of the second resistive element.

4. The driver circuit of claim 1, wherein the driver circuit further comprises:
    a first resistive element, wherein a terminal of the first resistive element is coupled to one of the first voltage and the data output terminal, the first switch is arranged to selectively couple another terminal of the first resistive element to the other of the first voltage and the data output terminal;
    a second resistive element, wherein a terminal of the second resistive element is coupled to one of the data output terminal and the second voltage, the second switch is arranged to selectively couple another terminal of the second resistive element to the other of the data output terminal and the second voltage;
    a third resistive element, wherein a terminal of the third resistive element is coupled to one of the first voltage and the data output terminal, the third switch is arranged to selectively couple another terminal of the third resistive element to the other of the first voltage and the data output terminal; and
    a fourth resistive element, wherein a terminal of the fourth resistive element is coupled to one of the data output terminal and the second voltage, the fourth switch is arranged to selectively couple another terminal of the fourth resistive element to the other of the data output terminal and the second voltage.

5. The driver circuit of claim 4, wherein a ratio of a resistance of the first resistive element to a resistance of the third resistive element is equal to a ratio of a resistance of the second resistive element to a resistance of the fourth resistive element.

6. The driver circuit of claim 4, wherein a resistance of the first resistive element is equal to a resistance of the third resistive element, and a resistance of the second resistive element is equal to a resistance of the fourth resistive element.

7. The driver circuit of claim 1, wherein when the first switch is switched on, and the third switch is switched off, the output data is at the third voltage level; when the first switch is switched off, and the third switch is switched on, the output data is at a fourth voltage level different from the third voltage level.

8. A driver circuit, comprising:
a pair of differential data output terminals, arranged for outputting output data, the pair of differential data output terminals comprising a first data output terminal and a second data output terminal;
a first switch;
a first variable impedance circuit, wherein a first terminal of the first variable impedance circuit is coupled to one of a first voltage and the first data output terminal, and the first switch is arranged to selectively couple a second terminal of the first variable impedance circuit to the other of the first voltage and the first data output terminal;
a second switch; and
a second variable impedance circuit, wherein a first terminal of the second variable impedance circuit is coupled to one of a second voltage and the second data output terminal, and the second switch is arranged to selectively couple a second terminal of the second variable impedance circuit to the other of the second voltage and the second data output terminal.

9. The driver circuit of claim 8, wherein the first variable impedance circuit is configured to provide a first variable impedance between the first terminal and the second terminal of the first variable impedance circuit; the second variable impedance circuit is configured to provide a second variable impedance between the first terminal and the second terminal of the second variable impedance circuit; each of the first variable impedance and the second variable impedance has a first impedance value and a second impedance value at least, and the first impedance value is different from the second impedance value.

10. The driver circuit of claim 8, wherein the first variable impedance circuit comprises:
a first resistive element, coupled to the second terminal of the first variable impedance circuit;
a third switch, arranged to selectively couple the first terminal of the first variable impedance circuit to the second terminal of the first variable impedance circuit through the first resistive element;
a fourth switch, arranged to selectively couple the first terminal of the first variable impedance circuit to the second terminal of the first variable impedance circuit through the first resistive element;
a second resistive element, coupled to the second terminal of the first variable impedance circuit;
a fifth switch, arranged to selectively couple the first terminal of the first variable impedance circuit to the second terminal of the first variable impedance circuit through the second resistive element; and
a sixth switch, arranged to selectively couple the first terminal of the first variable impedance circuit to the second terminal of the first variable impedance circuit through the second resistive element.

11. The driver circuit of claim 10, wherein when one of the third switch and the fourth switch is switched on, the other of the third switch and the fourth switch is switched off; when one of the fifth switch and the sixth switch is switched on, the other of the fifth switch and the sixth switch is switched off.

12. The driver circuit of claim 10, wherein when each of the third switch and the fifth switch is switched on, each of the fourth switch and the sixth switch is switched off; when the third switch is switched on and the fifth switch is switched off, each of the fourth switch and the sixth switch is switched off.

13. The driver circuit of claim 8, wherein the first variable impedance circuit comprises:
a third switch and a first resistive element, wherein a terminal of the first resistive element is coupled to one of the first terminal and the second terminal of the first variable impedance circuit, and the third switch is arranged to selectively couple another terminal of the first resistive element to the other of the first terminal and the second terminal of the first variable impedance circuit;
a fourth switch and a second resistive element, wherein a terminal of the second resistive element is coupled to one of the first terminal and the second terminal of the first variable impedance circuit, and the fourth switch is arranged to selectively couple another terminal of the second resistive element to the other of the first terminal and the second terminal of the first variable impedance circuit;
a fifth switch and a third resistive element, wherein a terminal of the third resistive element is coupled to one of the first terminal and the second terminal of the first variable impedance circuit, and the fifth switch is arranged to selectively couple another terminal of the third resistive element to the other of the first terminal and the second terminal of the first variable impedance circuit; and
a sixth switch and a fourth resistive element, wherein a terminal of the fourth resistive element is coupled to one of the first terminal and the second terminal of the first variable impedance circuit, and the sixth switch is arranged to selectively couple another terminal of the fourth resistive element to the other of the first terminal and the second terminal of the first variable impedance circuit.

14. The driver circuit of claim 13, wherein when one of the third switch and the fourth switch is switched on, the other of the third switch and the fourth switch is switched off; when one of the fifth switch and the sixth switch is switched on, the other of the fifth switch and the sixth switch is switched off.

15. The driver circuit of claim 13, wherein when each of the third switch and the fifth switch is switched on, each of the fourth switch and the sixth switch is switched off; when the third switch is switched on and the fifth switch is switched off, each of the fourth switch and the sixth switch is switched off.

16. A driver circuit, comprising:
a pair of differential data output terminals, arranged for outputting output data, the pair of differential data output terminals comprising a first data output terminal and a second data output terminal;
a first variable impedance circuit, switchably coupled between a first node and the first data output terminal to provide a first variable impedance between the first node and the first data output terminal, wherein the first node is coupled to a first voltage; and
a second variable impedance circuit, switchably coupled between the second data output terminal and a second node to provide a second variable impedance between the second data output terminal and the second node, wherein the second node is coupled to a second voltage different from the first voltage; each of the first variable impedance and the second variable impedance has a first impedance value and a second impedance value at least, and the first impedance value is different from the second impedance value.

17. The driver circuit of claim 16, wherein the first variable impedance circuit comprises:
- a first resistive element;
- a first switch, wherein when the first variable impedance circuit is coupled between the first node and the first data output terminal, the first switch is arranged to selectively couple the first voltage to the first data output terminal through the first resistive element;
- a second switch, wherein when the first variable impedance circuit is coupled between the first node and the first data output terminal, the second switch is arranged to selectively couple the first voltage to the first data output terminal through the first resistive element;
- a second resistive element;
- a third switch, wherein when the first variable impedance circuit is coupled between the first node and the first data output terminal, the third switch is arranged to selectively couple the first voltage to the first data output terminal through the second resistive element; and
- a fourth switch, wherein when the first variable impedance circuit is coupled between the first node and the first data output terminal, the fourth switch is arranged to selectively couple the first voltage to the first data output terminal through the second resistive element.

18. The driver circuit of claim 17, wherein when the first variable impedance circuit is arranged to provide the first variable impedance having the first impedance value, each of the first switch and the third switch is switched on, and each of the second switch and the fourth switch is switched off; when the first variable impedance circuit is arranged to provide the first variable impedance having the second impedance value, the first switch is switched on, and each of the second switch, the third switch and the fourth switch is switched off.

19. The driver circuit of claim 16, wherein the first variable impedance circuit comprises:
- a first switch and a first resistive element, wherein when the first variable impedance circuit is coupled between the first node and the first data output terminal, a terminal of the first resistive element is coupled to one of the first node and the first data output terminal, and the first switch is arranged to selectively couple another terminal of the first resistive element to the other of the first node and the first data output terminal;
- a second switch and a second resistive element, wherein when the first variable impedance circuit is coupled between the first node and the first data output terminal, a terminal of the second resistive element is coupled to one of the first node and the first data output terminal, and the second switch is arranged to selectively couple another terminal of the second resistive element to the other of the first node and the first data output terminal;
- a third switch and a third resistive element, wherein when the first variable impedance circuit is coupled between the first node and the first data output terminal, a terminal of the third resistive element is coupled to one of the first node and the first data output terminal, and the third switch is arranged to selectively couple another terminal of the third resistive element to the other of the first node and the first data output terminal; and
- a fourth switch and a fourth resistive element, wherein when the first variable impedance circuit is coupled between the first node and the first data output terminal, a terminal of the fourth resistive element is coupled to one of the first node and the first data output terminal, and the fourth switch is arranged to selectively couple another terminal of the fourth resistive element to the other of the first node and the first data output terminal.

20. The driver circuit of claim 19, wherein when the first variable impedance circuit is arranged to provide the first variable impedance having the first impedance value, each of the first switch and the third switch is switched on, and each of the second switch and the fourth switch is switched off; when the first variable impedance circuit is arranged to provide the first variable impedance having the second impedance value, the first switch is switched on, and each of the second switch, the third switch and the fourth switch is switched off.

* * * * *